(12) United States Patent
Kawahara et al.

(10) Patent No.: US 8,390,046 B2
(45) Date of Patent: Mar. 5, 2013

(54) SEMICONDUCTOR DEVICE

(75) Inventors: Jun Kawahara, Kanagawa (JP);
Yoshihiro Hayashi, Kanagawa (JP);
Ippei Kume, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 229 days.

(21) Appl. No.: 12/947,254

(22) Filed: Nov. 16, 2010

(65) Prior Publication Data
US 2011/0121375 A1  May 26, 2011

(30) Foreign Application Priority Data
Nov. 25, 2009 (JP) ................ 2009-267073

(51) Int. Cl.
*H01L 29/772* (2006.01)
(52) U.S. Cl. . 257/296; 257/210; 257/211; 257/E29.242; 257/503
(58) Field of Classification Search .......... 257/210–211, 257/296, 379, 503, 508, E33.062–E33.066, 257/E31.124–E31.126, E51.019
See application file for complete search history.

(56) References Cited

U.S. PATENT DOCUMENTS

| 2007/0173012 | A1* | 7/2007 | Aoki | 438/238 |
| 2008/0182399 | A1 | 7/2008 | Cho | |
| 2010/0123199 | A1* | 5/2010 | Kawahara et al. | 257/379 |
| 2010/0224922 | A1* | 9/2010 | Shinhara | 257/296 |

FOREIGN PATENT DOCUMENTS

| JP | 2004-342787 | 12/2004 |
| JP | 2007-201101 | 8/2007 |
| JP | 2008-251763 | 10/2008 |

OTHER PUBLICATIONS

Chinese Official Action—201010563443.3—Nov. 2, 2012.

* cited by examiner

*Primary Examiner* — Mamadou Diallo
(74) *Attorney, Agent, or Firm* — Young & Thompson

(57) ABSTRACT

A semiconductor device of the present invention has a semiconductor substrate having a transistor formed thereon; a multi-layered interconnect formed on the semiconductor substrate, and having a plurality of interconnect layers, respectively composed of an interconnect and an insulating film, stacked therein; and a capacitance element having a lower electrode (lower electrode film), a capacitor insulating film, and an upper electrode (upper electrode film), all of which being embedded in the multi-layered interconnect, so as to compose a memory element, and further includes at least one layer of damascene-structured copper interconnect (second-layer interconnect) formed between the capacitance element and the transistor; the upper surface of one of the interconnects (second-layer interconnect) and the lower surface of the capacitance element are aligned nearly in the same plane; and at least one layer of copper interconnect (plate line interconnect) is formed over the capacitance element.

21 Claims, 22 Drawing Sheets

FIG. 1A
FIG. 1B
FIG. 1C
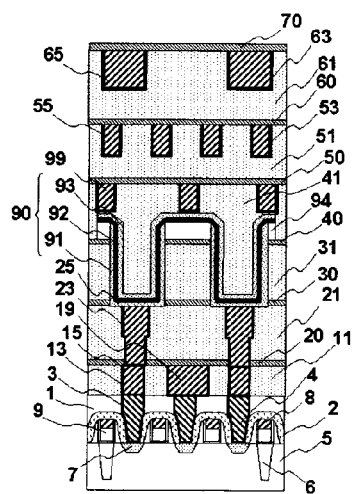
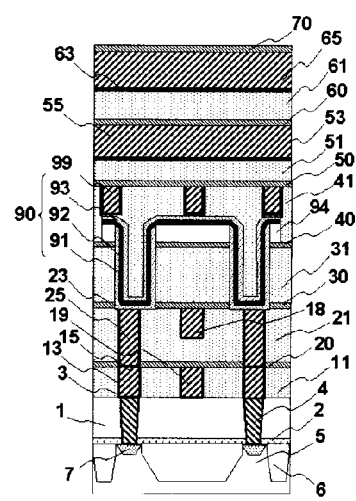
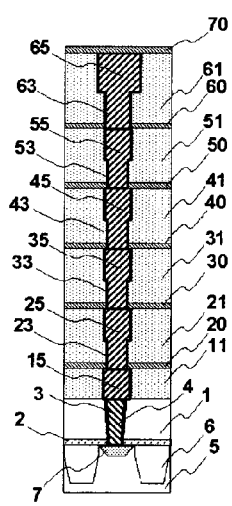
FIG. 2A
FIG. 2B
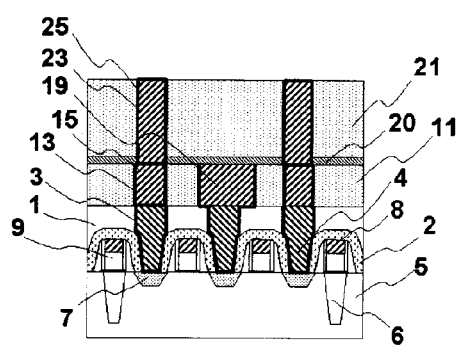
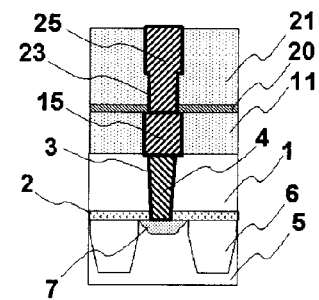

FIG. 28A
FIG. 28B
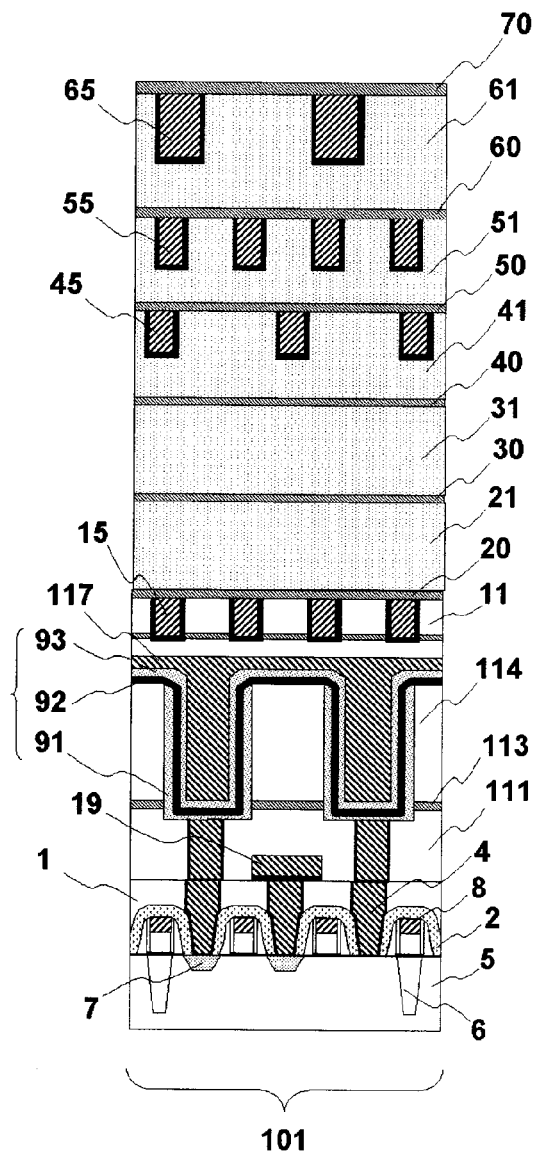
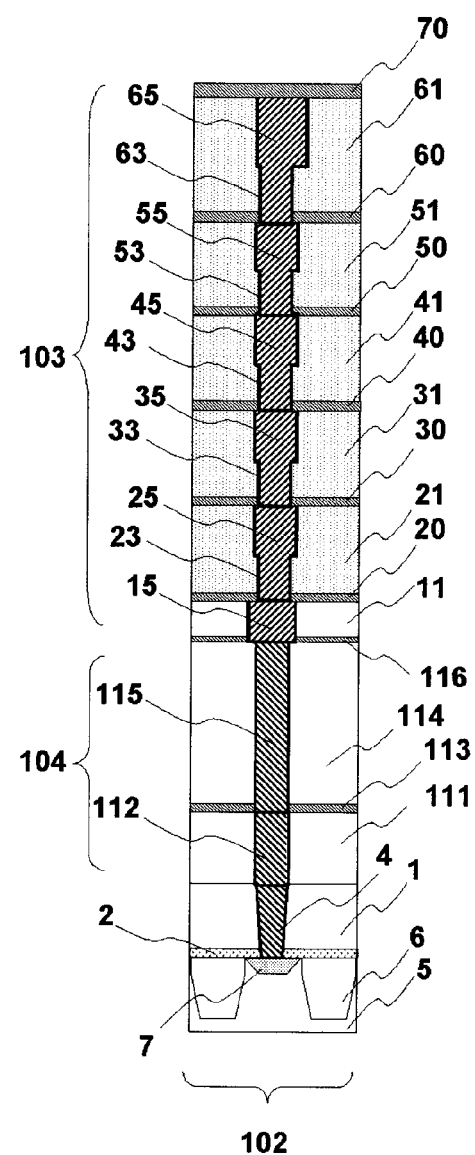

FIG. 29A
FIG. 29B
FIG. 29C
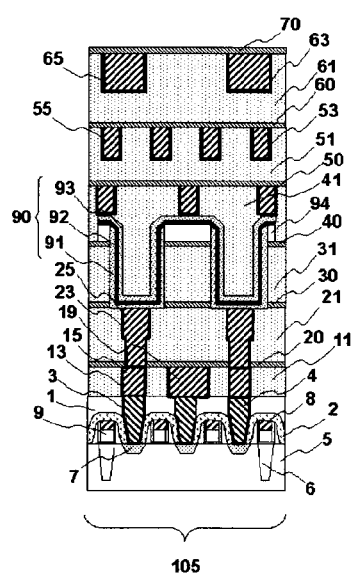
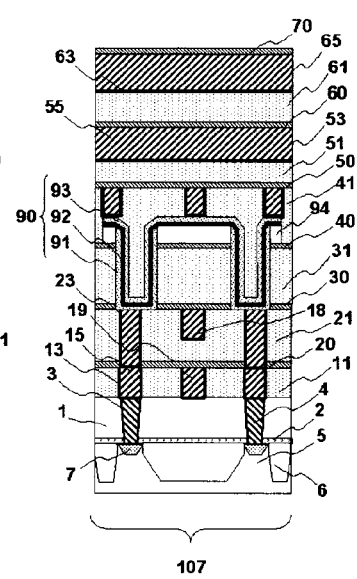
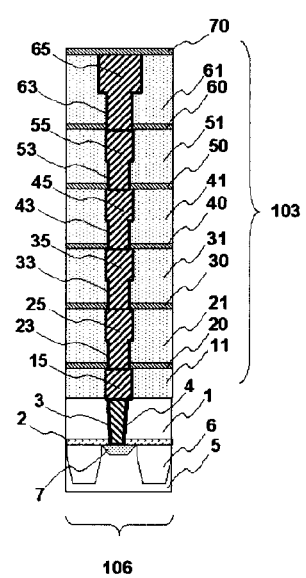

SEMICONDUCTOR DEVICE

This application is based on Japanese patent application No. 2009-267073 the content of which is incorporated thereinto by reference.

BACKGROUND

1. Technical Field

The present invention relates to a semiconductor device.

2. Background Art

In recent years, there has been a measure of reducing the height of contact in logic circuit section, aiming at increasing operation speed of semiconductor devices. A technique of this sort is known by the one described in Japanese Laid-Open Patent Publication No. 2007-201101 (Patent Document 1). According to Patent Document 1, upper electrodes of capacitance elements are connected by upper capacitor interconnects which are formed at the same level of height with interconnects in a logic circuit section, and thereby, the aspect ratio of the contact (logic contact) in the logic circuit section may be reduced while ensuring a sufficient level of film thickness of capacitance elements, needing neither processes solely required for forming interconnects, called plate line, for connecting the upper electrodes, nor dedicated equipment.

Also various proposals have been made on techniques for similarly reducing the height of contact in the logic circuit section [see Japanese Laid-Open Patent Publication Nos. 2004-342787 (Patent Document 2) and 2008-251763 (Patent Document 3), for example].

Patent Document 2 describes that a first-layer interconnect is formed in the middle position of the capacitance elements, in order to reduce the height of contact, and thereby the height of contact in the logic circuit section may be reduced similarly as described in Patent Document 1.

Patent Document 3 describes that the height of contact in the logic circuit section may be reduced, by providing an assist interconnect in the same layer with pads to be connected to the lower electrodes of the capacitance elements, and in the peripheral circuit region.

SUMMARY

However, in the techniques described in Patent Documents 1 to 3, the interconnects used for connecting the capacitance elements and transistors are composed of tungsten (W) having a high resistivity. For this reason, the techniques described in the above have occasionally been suffering from lowering in operation speed of the logic circuits.

According to the present invention, there is provided a semiconductor device which includes:

a semiconductor substrate having a transistor formed thereon;

a multi-layered interconnect formed on the semiconductor substrate, and having a plurality of interconnect layers, respectively composed of an interconnect and an insulating film, stacked therein; and a capacitance element having a lower electrode, a capacitor insulating film, and an upper electrode, embedded in the multi-layered interconnect, so as to compose a memory element, further comprising at least one layer of damascene-structured copper interconnect formed between the capacitance element and the transistor, the upper surface of one of the interconnects and the lower surface of the capacitance element being aligned nearly in the same plane, and the above-described at least one layer of copper interconnect is formed over the capacitance element.

Since at least one layer of damascene-structured copper interconnect is formed between the capacitance element and the transistor, so that interconnect resistance may be reduced. As a consequence, high speed operation of the semiconductor device may be ensured.

According to the present invention, a semiconductor device successfully suppressed from being degraded in the operation speed may be provided.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 1A to 1C are sectional views illustrating a semiconductor device according to a first embodiment of the present invention;

FIGS. 2A, 2B, 3A, 3B, 4A, 4B, 5A, 5B, 6A, 6B, 7A, 7B, 8A, 8B, 9A, 9B, 10A, 10B, 11A, 11B, 12A and 12B are sectional views illustrating steps of manufacturing the semiconductor device according to one example of the first embodiment of the present invention;

FIGS. 28A and 28B are sectional views comparatively illustrating semiconductor devices according to a related art; and FIGS. 29A, 29B and 29C are sectional views comparatively illustrating another example of the present invention.

DETAILED DESCRIPTION

Figure 3A:
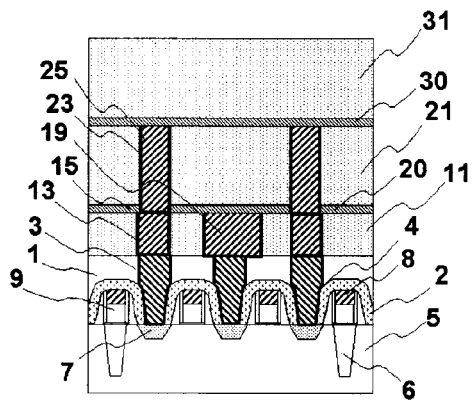

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Embodiments of the present invention will be explained referring to the attached drawings. Note that, in all drawings, all similar constituents will be given similar reference numerals or symbols, so as to appropriately avoid repetitive explanations.

First Embodiment

Figure 8A:
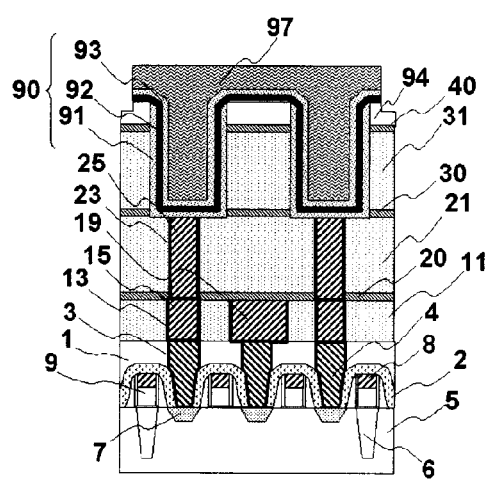
Figure 8B:
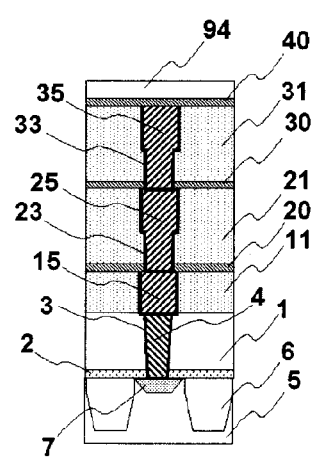
Figure 9A:
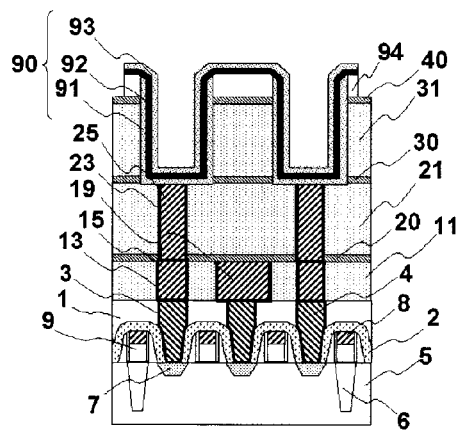
Figure 9B:
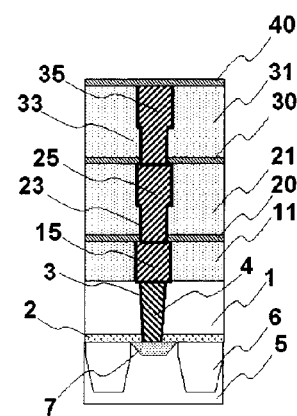
Figure 10A:
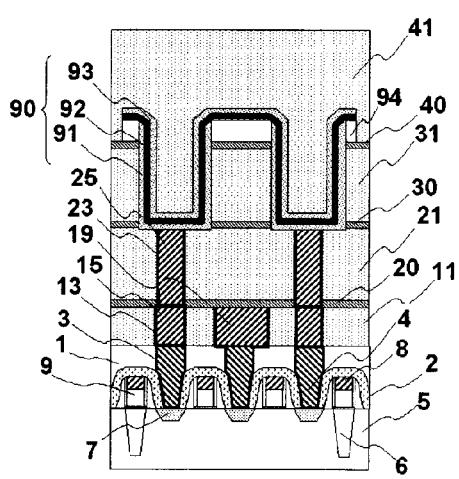
Figure 10B:
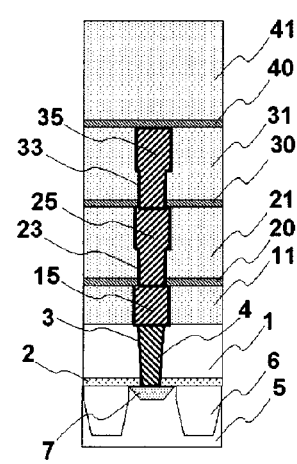

FIGS. 1A, 1B and 1C are sectional views illustrating a semiconductor device according to a first embodiment of the present invention, and FIG. 2A to FIG. 12B are sectional views sequentially illustrating steps of manufacturing the semiconductor device illustrated in FIGS. 1A to 1C. FIG. 1A on the left and FIG. 1B at the center are sectional views of the memory circuit region taken in the directions normal to each other. FIG. 10 on the right is a representative sectional view of the logic circuit region. FIGS. 2A, 3A, 4A, 5A, 6A, 7A, 8A, 9A, 10A, 11A and 12A on the left are representative sectional views of the memory circuit region, and FIGS. 2B, 3B, 4B, 5B, 6B, 7B, 8B, 9B, 10B, 11B and 12B on the right are representative sectional views of the logic circuit region. FIG. 16 to FIG. 21 are top views (planar layouts) of the semiconductor devices illustrated in FIG. 2A, FIG. 3A, FIG. 5A, FIG. 6A, FIG. 9A and FIG. 12A, respectively. FIGS. 13A to 13C and FIGS. 14A to 14C illustrate modified examples of the first embodiment. Also in these drawings, FIG. 13A and FIG. 14A on the left, and FIG. 13B and FIG. 14B at the center are sectional views of the memory circuit regions, taken in the directions normal to each other. FIG. 13C and FIG. 14C on the right are representative sectional views of the logic circuit regions.

Configuration of the semiconductor device of the first embodiment will be explained below.

The semiconductor device of this embodiment is an integrated circuit device having a memory region and a logic region formed on a single semiconductor substrate. More specifically, the semiconductor device has a memory region having memory elements and a first logic circuit for controlling the memory elements; and a logic region different from the memory region and having a second logic circuit provided thereto, both regions being mounted in an integrated manner.

The logic region may be configured as a region having a high-speed logic circuit such as CPU (Central Processing Unit).

As illustrated in FIGS. 1A to 1C, the semiconductor device of this embodiment has a semiconductor substrate (silicon substrate 5) having transistors (MOS transistors 9) formed thereon; a multi-layered interconnect formed over the silicon substrate 5, and configured by stacking a plurality of interconnect layers respectively composed of an interconnect and an insulating film (a third-layer interconnect 35 and a third-layer insulating interlayer 31, a fourth-layer interconnect 45 and a fourth-layer insulating interlayer 41); and capacitance elements 90 each of which having a lower electrode (lower electrode film 91), a capacitor insulating film 92, and an upper electrode (upper electrode film 93), and all of which being embedded in the multi-layered interconnect, so as to compose a memory element. At least one layer of damascene-structured copper interconnect (second-layer interconnect 25) is formed between the capacitance elements 90 and the MOS transistors 9, the upper surface of one of the interconnect (second-layer interconnect 25) and the lower surface of the capacitance elements 90 are aligned nearly in the same plane, and at least one layer of copper interconnect (plate line interconnect 99) is formed over the capacitance elements 90.

In addition, at least one layer of damascene-structured copper interconnect (a third-layer interconnect 35 and a fourth-layer interconnect 45) may be provided between a lower capacitor interconnect (second-layer interconnect 25) connected to the lower electrode, and an upper capacitor interconnect (plate line interconnect 99) connected to the upper electrode.

In addition, as illustrated in FIGS. 1A and 1B, in the memory circuit region having the capacitance elements 90 provided thereto, the capacitance elements 90 are embedded in the multi-layered interconnect structure. In the multi-layered interconnect structure, a column decoding line 18 is formed in the same layer with the lower capacitor interconnect (second interconnect 25). In this embodiment, by providing either one of, or both of, a row decoding line 17 (not illustrated) and the column decoding line 18 in the same layer with the capacitance elements 90, or in the same layer with the lower capacitor interconnect, it may no longer be necessary to use interconnects above the capacitance elements 90, and thereby the number of interconnect layers in the memory circuit region may be reduced. Accordingly, the portion above the memory circuit region may now be available for the interconnects of the logic circuit region, or for connecting the individual circuit regions, and thereby the chip area may be shrunk.

Next, a method of manufacturing the semiconductor device of this embodiment will be explained.

FIGS. 2A and 2B illustrate a board manufactured by a standard method of forming an integrated circuit, and having a structure obtained after the MOS transistors 9 and the second-layer interconnect 25 were formed.

A gate insulating film of the MOS transistors 9 formed on the silicon substrate 5 is a high-k gate insulating film, and may typically be configured by silicon oxynitride such as SiON, or hafnium oxynitride. Materials adoptable herein to compose a gate electrode 8 include polysilicon, metal silicides of Ni, Co, Ti or Pt, or a stacked article of them. Still alternatively, the gate electrode 8 may be a metal gate electrode partially containing Ti, Ta, Al, or electro-conductive nitride of these elements. In particular, adoption of the metal gate electrode is advantageous not only in that operational current of the transistors in the logic region may be increased, but also in that the resistivity of the word lines may be reduced since the gate electrodes 8 configure the word lines of DRAM section, so that higher operational speed may be achieved by combining it with an eDRAM structure having capacitance elements 90 embedded in the multi-layered interconnect.

In FIGS. 2A and 2B, reference numeral 1 represents a contact-forming insulating interlayer, 2 represents an etching stopper film, 3 represents a barrier metal film in contact portion, 4 represents a contact plug, 5 represents the silicon (Si) substrate, 6 represents an element-isolating STI (shallow trench isolation), 7 represents an impurity-diffused layer, and 8 represents the gate electrode. Reference numeral 11 represents a first-layer insulating interlayer, 13 represents a first-layer interconnect barrier metal film, 15 represents first-layer interconnect, 20 represents a first-layer interconnect cap film, 21 represents a second-layer insulating interlayer, 23 represents a second-layer interconnect barrier metal film, and 25 represents a second-layer interconnect. A bit line 19 is the one in the memory circuit section, formed at the same time with the first-layer interconnect 15.

Note that the bit line 19 herein is formed in the same layer with the first-layer interconnect 15. In this embodiment, there is no interconnect layer provided solely for the bit lines, unlike the case described in Patent Document 2 (Japanese Laid-Open Patent Publication Nos. 2004-342787) and so forth. As a consequence, the multi-layered interconnect structure may make the best use of a limited number of layers.

The transistor (MOS transistor 9) in this embodiment may be configured by a first impurity-diffused layer (impurity-diffused layer 7) formed in the surficial portion of the silicon substrate 5, a second impurity-diffused layer (impurity-diffused layer 7) formed in the surficial portion of the silicon substrate 5, a gate insulating film provided on the silicon substrate 5 in the region between the first impurity-diffused layer (impurity-diffused layer 7) and the second impurity-diffused layer (impurity-diffused layer 7), and the gate electrode 8 provided on the gate insulating film. In this configuration, either one of the first impurity-diffused layer and the second impurity-diffused layer may be assumed as a source impurity-diffused layer, and the other as a drain impurity-diffused layer.

The contact-forming insulating interlayer 1 illustrated in FIGS. 2A and 2B is composed of a silicon oxide film, contact plugs 4 are composed of tungsten, and a barrier metal film in contact portion 3 is composed of a titanium nitride/titanium stacked film. The first-layer insulating interlayer 11 and the second-layer insulating interlayer 21 are composed of a low-k insulating film, specifically a SiOCH film, and more specifically an MPS (Molecular Pore Stack) film. The MPS film is detailed by M. Ueki in IEEE IEDM, pp 973-976 (2007). The first-layer interconnect barrier metal film 13 is composed of a tantalum/tantalum nitride stacked film, and the first-layer interconnect 15 is composed of copper. The first-layer interconnect cap film 20 and the second-layer interconnect cap film 30 is composed of an SCC (Silica amorphous Carbon Composite) film. Also the SCC film is detailed, similarly to the MPS film, again by M. Ueki in IEEE IEDM, pp 973-976 (2007). The SCC film is characterized by its barrier performance against diffusion of copper, despite it is a sort of SiOCH film. It is also characterized by its mechanical strength of as large as 20 GPa or around, while the dielectric constant thereof is 3.1 or around. The film ensures an excellent step coverage, since the film is formed in a mode allowing surface reaction to vigorously proceed. These films are characterized by their larger carbon content, as compared with that in the generally-known SiOCH film. The SCC film has a carbon content approximately twice as large as that of SiOCH film, and MPS film has a carbon content of approximately four times as large as that of the SiOCH film. Oxygen contents of these films are relatively small as compared with the generally-known SiOCH film, wherein the SCC film has a value of approximately ¾, and the MPS film has a value of approximately ½. The difference in the compositions between the MPS and SCC films hold the key for formation of openings used for the capacitance elements.

Now, a technique of forming the second-layer interconnect 25 will be briefed. After the first-layer interconnect 15 is formed, the first-layer interconnect cap film 20 composed of the SCC film is formed, and then the MPS film is formed as the second-layer insulating interlayer 21. A silicon oxide film (not illustrated) is then formed as a mask used for the subsequent process. The openings (not illustrated) allowing therein formation of the second-layer interconnect is then formed by so-called dual damascene process based on lithography and dry etching. A part of the openings herein include via holes allowing therein electrical connection with the first-layer interconnect 15. The second-layer interconnect barrier metal film 23 is deposited in the openings by sputtering, followed by deposition of copper which serves as a seed layer in copper plating. The openings are then filled up with copper by plating. The copper interconnect in this embodiment is an interconnect containing copper, or mainly composed of copper, or solely composed of copper. From the viewpoint of high-speed operation, the copper interconnect is preferably an interconnect mainly composed of copper, and more preferably an interconnect solely composed of copper. Copper composing the copper interconnect may contain metal additives such as aluminum, silver and so forth. Excessive portions of the second-layer interconnect barrier metal film 23 and copper are then removed typically by CMP, so as to leave them in the openings for forming the second-layer interconnect, to thereby form the second-layer interconnect 25. The silicon oxide film is removed during the process, and does not therefore remain on the second-layer insulating interlayer 21. Thereafter, the second-layer interconnect cap film 30, composed of the SCC film similarly to the first layer, is formed.

Figure 16:
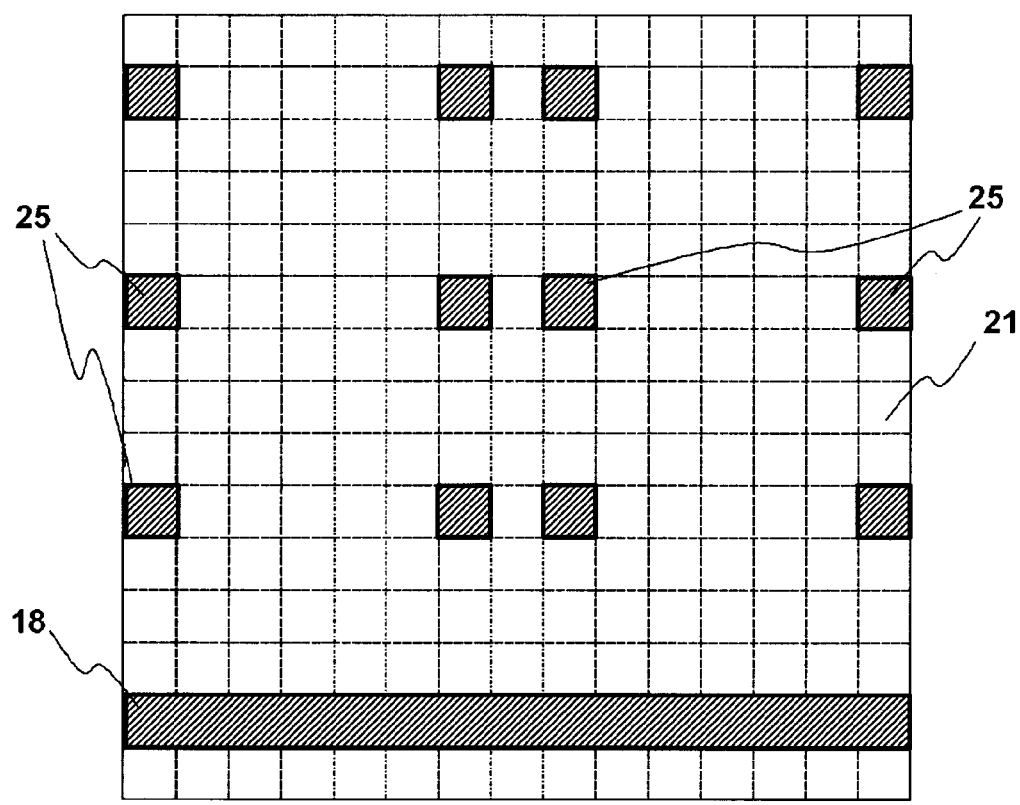
FIG. 16 is a plan view illustrating a layout which appears in the manufacturing process of the semiconductor device illustrated in FIG. 2A, according to one example of the first embodiment of the present invention.

While each of the insulating interlayer and the cap film in this embodiment is composed of a single-layered insulating film, it may alternatively be composed of a stacked structure having a plurality of species of insulating film. For example, the insulating interlayer may be composed of a stacked structure having an MPS film combined with other SiOCH film, and the cap film may be composed of a stacked structure of a SiC film and a SiCN film. Note that FIG. 16 illustrates a planar layout before the second-layer interconnect cap film 30 is formed. As seen in FIG. 16, the column decoding line 18, the second-layer insulating interlayer 21, and the second-layer interconnect 25 are provided in the same layer.

Figure 3B:
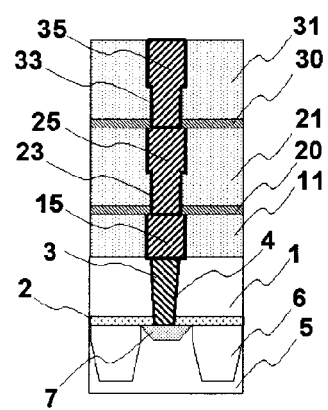
Figure 17:
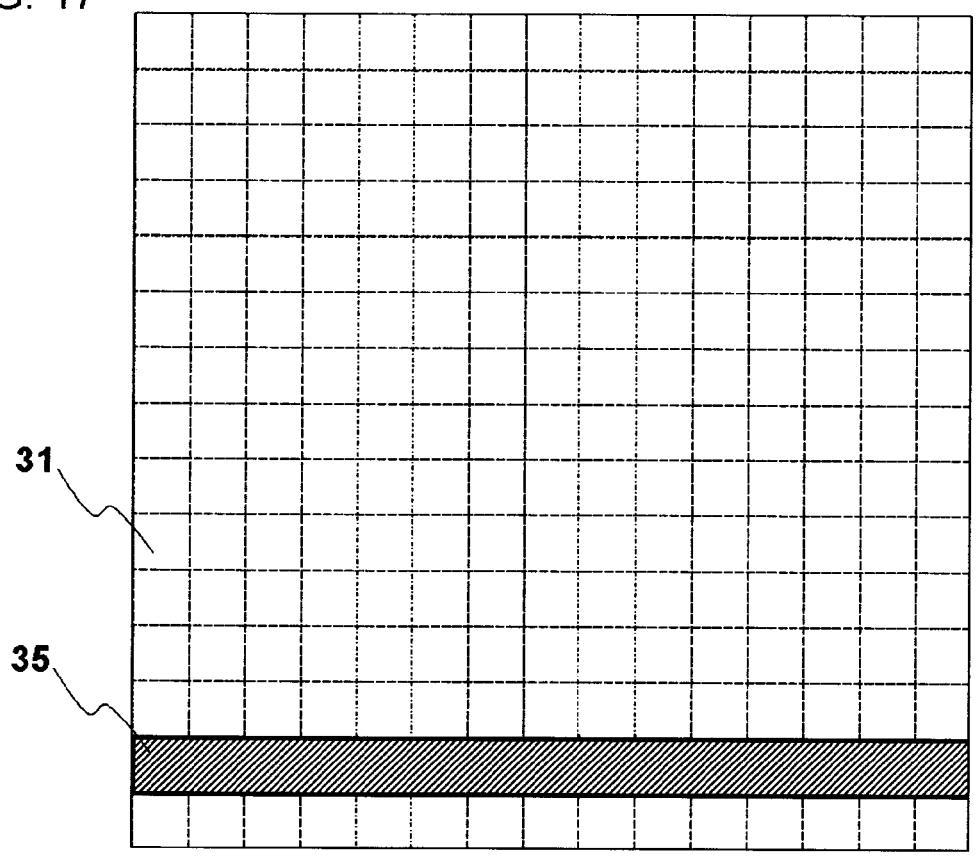
FIG. 17 is a plan view illustrating a layout which appears in the manufacturing process of the semiconductor device illustrated in FIG. 3A, according to one example of the first embodiment of the present invention.

As illustrated in FIGS. 3A and 3B, the third-layer interconnect 35 is further formed. The method of forming is same as that of forming the second-layer interconnect 25. Since the memory circuit region will have the capacitance elements 90 later formed therein, so that the third-layer interconnect 35 is formed only in the logic circuit region. Note that FIG. 17 illustrates a planar layout before the third-layer interconnect cap film 40 is formed. As seen in FIG. 17, the third-layer insulating interlayer 31 and the third-layer interconnect 35 are provided in the same layer.

Figure 4A:
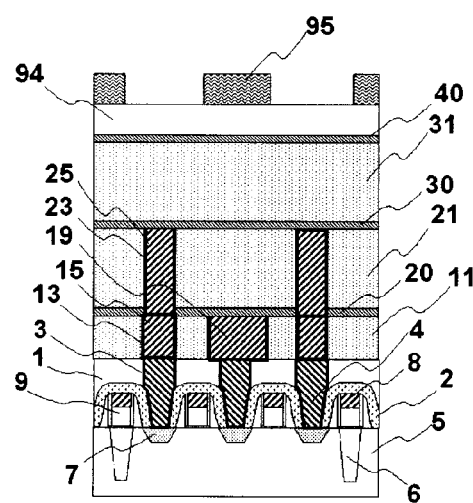
Figure 4B:
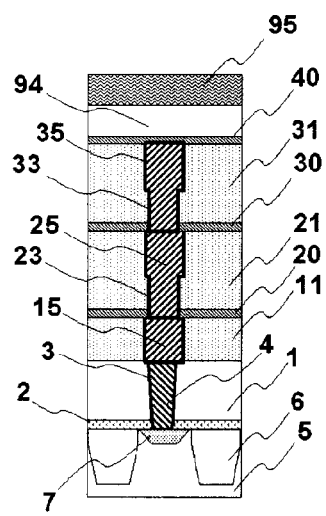

Next, as illustrated in FIGS. 4A and 4B, after the third-layer interconnect cap film 40 is deposited, a hard mask-forming insulating film 94 is formed. A resist film for cylinder forming process 95 is further formed by lithography. The hard mask-forming insulating film 94, configured herein by using a silicon oxide film, may alternatively be configured by a stacked structure with other insulating film. Still alternatively, a multi-layered resist structure, typically having an anti-reflective film provided at the interface with the resist film, may be adoptable.

Figure 5A:
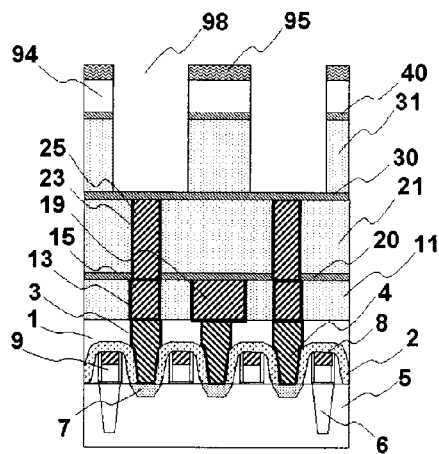
Figure 5B:
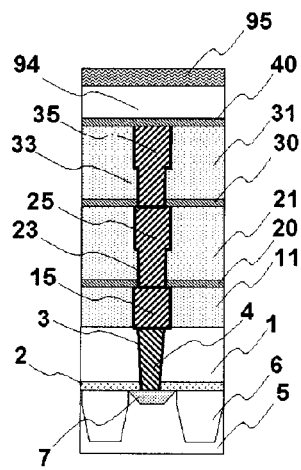
Figure 6A:
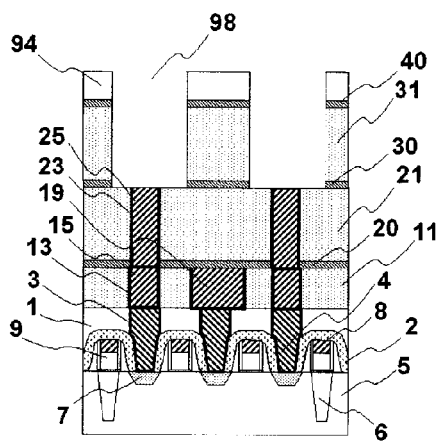
Figure 6B:
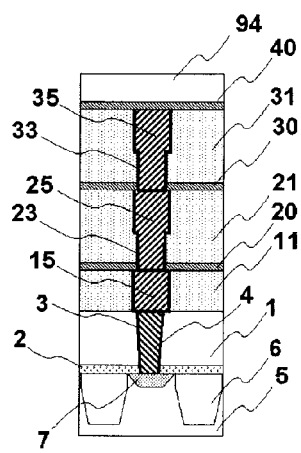
Figure 18:
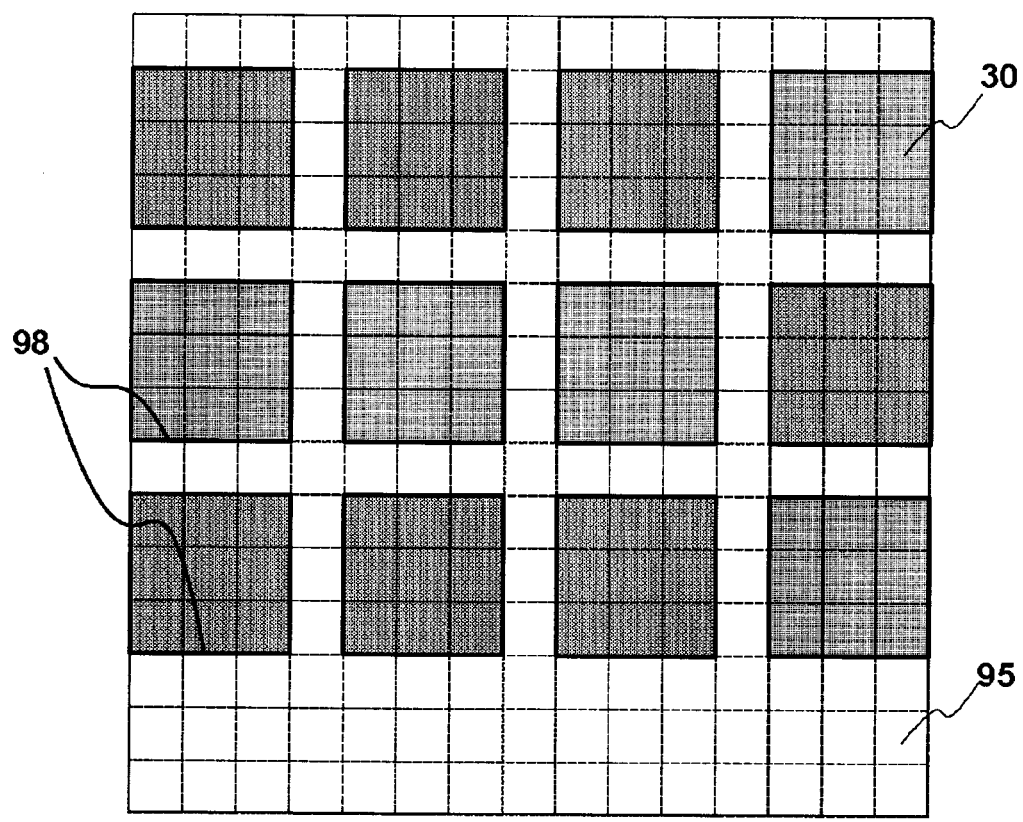
FIG. 18 is a plan view illustrating a layout which appears in the manufacturing process of the semiconductor device illustrated in FIG. 5A, according to one example of the first embodiment of the present invention.

Next, as illustrated in FIGS. 5A and 5B, openings in capacitance element 98 are formed. In this process, the second-layer interconnect cap film 30 it not etched, in order to avoid oxidation of the second-layer interconnect 25. Note that FIG. 18 illustrates a planar layout corresponded to FIG. 5A, wherein the resist film for cylinder forming process 95 is formed over the entire surface, except for the openings for forming capacitance element 98 allowing therein formation of the capacitance elements, in which the second-layer interconnect cap film 30 is exposed. By forming the capacitance element 90 into a quadrilateral geometry in the plan view like in this embodiment, light exposure under corrected optical proximity effect and patterning process such as dry etching may be facilitated. Since correction of the optical proximity effect is supposed to be more complicated particularly in the 32-nm, 28-nm, or further shrunk generation, so that the individual element pattern formed into a simple quadrilateral geometry or linear geometry are very effective, from the viewpoints of increasing bit density per unit area, or obtaining as-designed geometries.

The openings for forming capacitance element 98 are formed by dry etching of the insulating interlayer (third-layer insulating interlayer 31), wherein in this embodiment, an MPS film and an SCC film are used for insulating interlayer and the cap film, respectively, while being stacked with a SiOCH film. Since two these films have carbon contents largely different from each other, so that it is ready to control the ratio of MPS/SCC etch rate, so-called etching selectivity, by appropriately selecting conditions of the dry etching. The etching may, therefore, be stopped on the bottom of the cylindrical openings (openings for forming capacitance element 98), by increasing the MPS/SCC selectivity. In other words, the insulating interlayer (third-layer insulating interlayer 31) may be etched, while relatively reducing the etch rate of the cap film (second-layer interconnect cap film 30). By adopting the structure allowing a high controllability in processing, the openings for forming capacitance element may be obtained in a geometrically desirable manner. Assuming now the carbon/silicon ratios of the cap insulating film and the low-k SiOCH film as [cap insulating film (C/Si)] and [low-k SiOCH film (C/Si)], respectively, a relation of [cap insulating film (C/Si)]/[low-k SiOCH film (C/Si)]<2 may hold.

The insulating film (insulating interlayer, which is typically the third-layer insulating interlayer 31) may alternatively be composed of a stacked structure having a low-k SiOCH film which contains silicon (Si), oxygen (O) and carbon C, and a cap insulating film over the interconnect, and a silicon oxide film may be provided under the capacitor insulating film partially in a region excluding the openings for forming the capacitance elements 90. The silicon oxide film provided under the capacitor insulating film, partially in the region excluding the openings for forming the capacitance elements 90, may protect the cap film which resides under the silicon oxide film in the logic circuit section, and the copper interconnect and the insulating interlayer which reside further thereunder, in the process of forming the capacitance elements. Provision of the silicon oxide film contributes to prevent the copper interconnect in the logic circuit section from being elevated in resistivity or from being degraded in reliability typically due to oxidation, and to suppress the logic circuit section from being degraded in performance and from causing operational failure.

Figure 19:
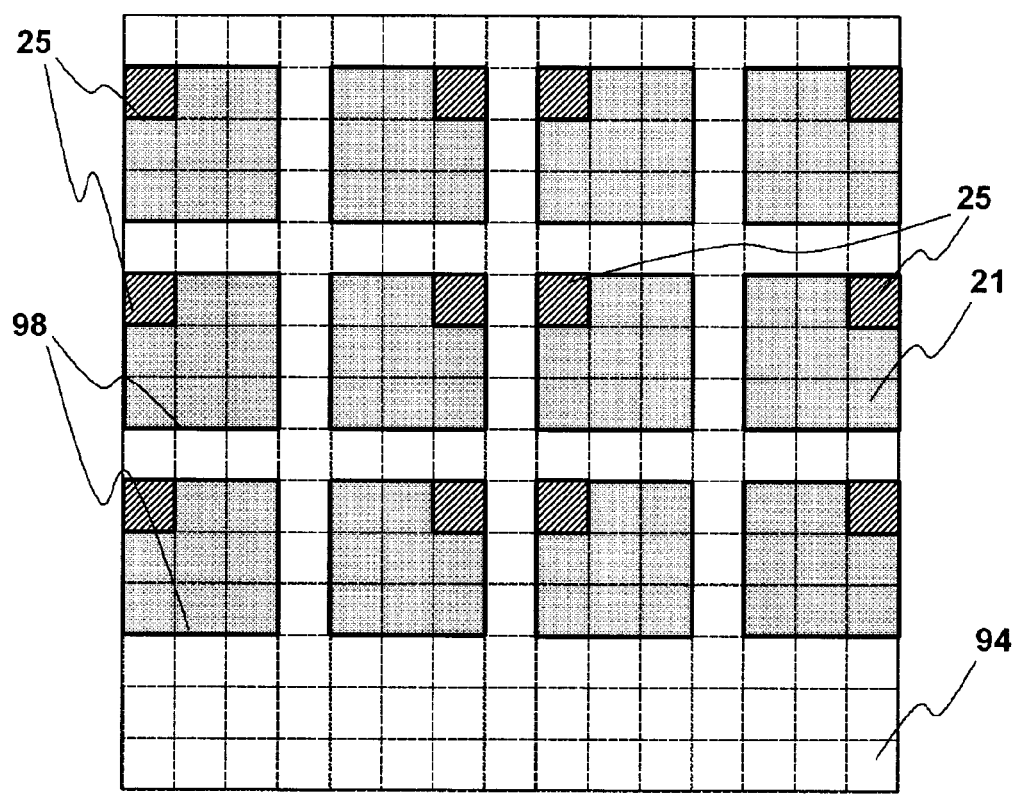
FIG. 19 is a plan view illustrating a layout which appears in the manufacturing process of the semiconductor device illustrated in FIG. 6A, according to one example of the first embodiment of the present invention.

The resist film for cylinder forming process 95 is then removed by ashing, and second-layer interconnect cap film 30 is removed by dry etching (FIGS. 6a and 6B), so as to allow connection of the lower electrodes (lower electrode film 91) of the capacitance elements 90 to the second-layer interconnect 15 which serves later as the lower interconnect. Note that FIG. 19 illustrates a planar layout corresponded to FIG. 6A, wherein the hard mask-forming insulating film 94 is formed over the entire surface, except for the openings for forming capacitance element 98 allowing therein formation of the capacitance elements, in which the second-layer insulating interlayer 21 and the second-layer interconnect 25 are exposed.

Figure 7A:
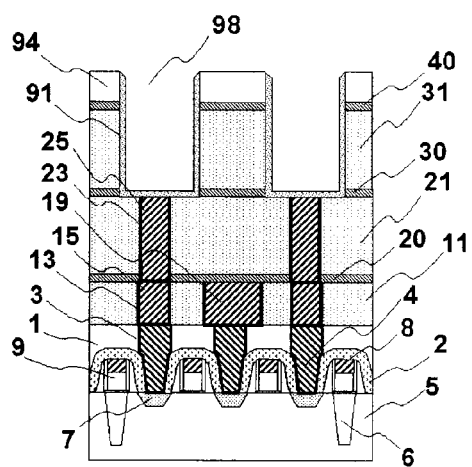
Figure 7B:
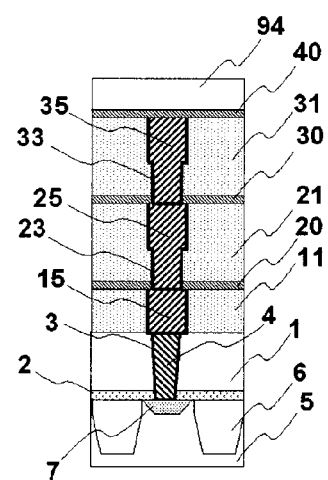

Next, the lower electrode film 91, which will serve as the lower electrodes of the capacitance elements 90, is formed, and a resist film 96 (not illustrated) for patterning lower electrodes is formed by lithography. The lower electrode film 91 is then removed by etching, using the resist film 96 for patterning the lower electrodes as a mask, and the resist film 96 for patterning the lower electrodes is removed by ashing (FIGS. 7A and 7B).

Next, the capacitor insulating film 92 and the upper electrode film 93 are formed, and a resist film 97 for patterning the upper electrodes, which serves as a mask for the patterning, is then formed by lithography. The capacitor insulating film 92 and the upper electrode film 93 are etched using the resist film 97 for patterning the upper electrodes as a mask. Since the etching in this process is carried out to some excessive degree so as to ensure in-plane uniformity of the process, so that a part of the hard mask-forming insulating film 94 is etched (FIG. 8A). In this way, the upper surface of the second-layer interconnect 25 and the lower surface of the capacitance elements 90 (lower surface of the electrode films 91) are aligned nearly in the same plane (while allowing variation ascribable to the manufacturing processes).

Since the lower electrode (lower electrode film 91) in this embodiment is brought into direct contact with the lower capacitor interconnect (second-layer interconnect 25 composed of a copper interconnect), so that a material composing the lower electrode (lower electrode film 91) is preferably designed to contain an electro-conductive metal (barrier metal) capable of functioning as a barrier against copper diffusion. For an exemplary case where the lower electrode film 91 has a multi-layered structure, the electro-conductive metal may be formed so as to cover the surface of the lower electrode film 91. In particular, the second-layer interconnect barrier metal film and the electro-conductive metal may be formed so as to cover the sidewall of the second-layer interconnect 25 and the surface of the lower electrode film 91 in a continuous manner. Examples of the electro-conductive metal adoptable herein include refractory metals or nitrides thereof, such as tantalum (Ta), tantalum nitride (TaN), titanium (Ti), titanium nitride (TiN), tungsten carbonitride (WCN), ruthenium (Ru), or stacked film composed of these materials.

As for materials for composing the capacitance elements 90 adoptable herein, those adoptable to the upper electrode film 93 and the lower electrode film 91 include Ti, TiN, Ta, TaN and Ru, which may be stacked with each other. The capacitor insulating film 92 may be exemplified by films composed of zirconium oxide ($ZrO_2$), zirconium aluminate ($ZrAlO_x$), and zirconium oxide added with lanthanoid such as Tb, Er and Yb.

The hard mask-forming insulating film 94 takes part in protecting especially the cap film which resides under the hard mask film in the logic circuit section, and the copper interconnects which resides further thereunder, in the processes of the above-described ashing and etching. In particular for the case where the insulating interlayer and the cap film are less durable against oxygen plasma, or less durable against etching process for patterning the capacitance film, the copper interconnect in the logic circuit section may be elevated in the resistivity or degraded in the reliability due to oxidation or the like, to thereby induce degradation of performances or operational failure of the logic circuit section, if the hard mask film is not provided.

Figure 20:
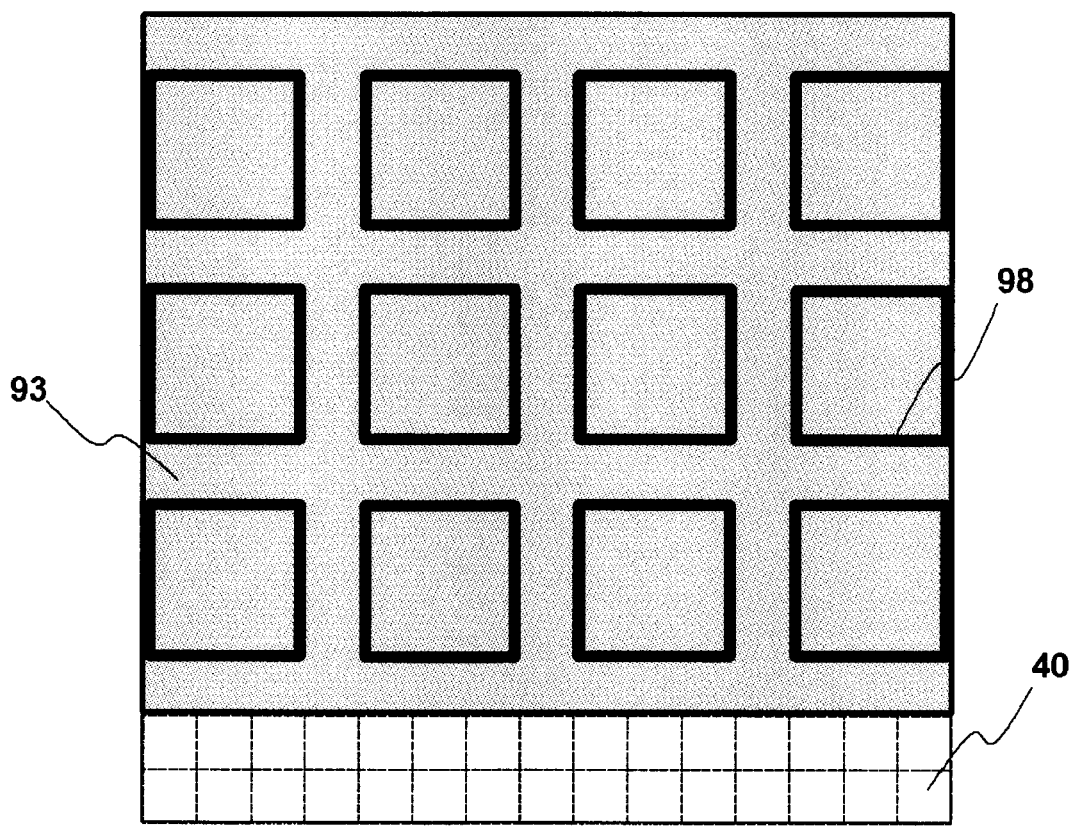
FIG. 20 is a plan view illustrating a layout which appears in the manufacturing process of the semiconductor device illustrated in FIG. 9A, according to one example of the first embodiment of the present invention.

Next, the resist film 97 for patterning upper electrode is removed by ashing, similarly to the case where the lower electrode is patterned. The hard mask-forming insulating film 94 is then etched using the upper electrode (upper electrode film 93) as a mask, so as to expose the third-layer interconnect cap film 40 (FIG. 9A). As a consequence, the hard mask-forming insulating film 94 remains unremoved only in the region where the capacitance film (capacitor insulating film 92) and the upper electrode (upper electrode film 93) reside. Note that FIG. 20 illustrates a planar layout corresponded to FIG. 9A, wherein the upper electrode film 93 is formed almost over the entire surface of the memory circuit region, the openings 98 for forming capacitance element are formed in the region where the capacitance elements will be formed later, and the region where the capacitance elements will not be formed later has the cap film 40 in third-layer interconnect exposed thereon.

This sort of structure having a part of the hard mask-forming insulating film 94 partially remained in the region where the capacitance film and the upper electrode reside, is very preferable for the case where the capacitance elements are embedded in the multi-layered interconnect, and the insulating interlayers of the multi-layered interconnect is composed of a low-k film, like in this embodiment. For the case where the capacitance elements 90 are formed in the multi-layered interconnect by the process of this embodiment, the hard mask-forming insulating film 94 almost always remains in the region described in the above.

Figure 11A:
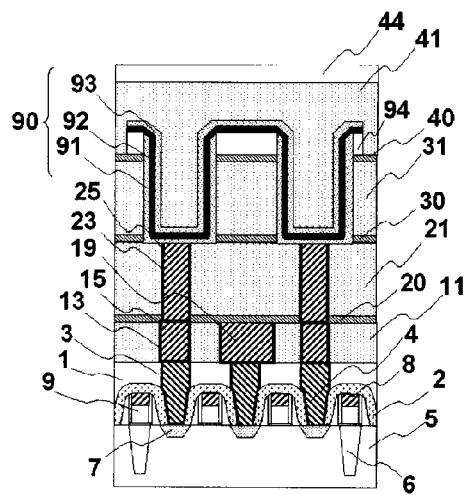
Figure 11B:
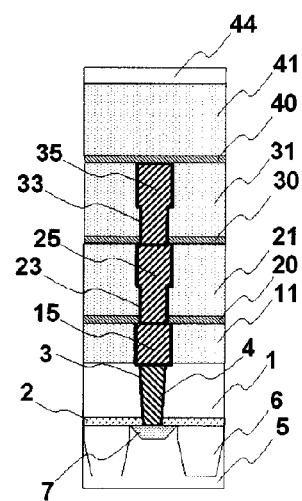
Figure 12A:
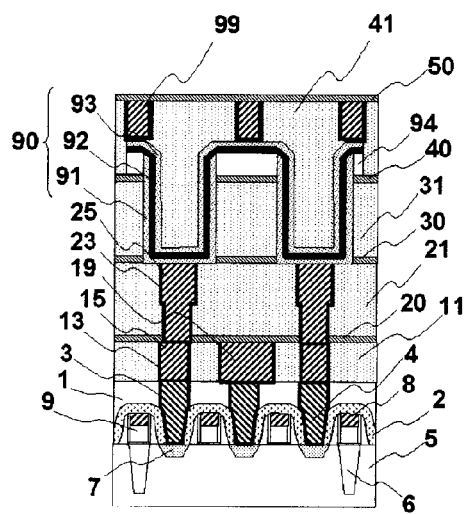
Figure 12B:
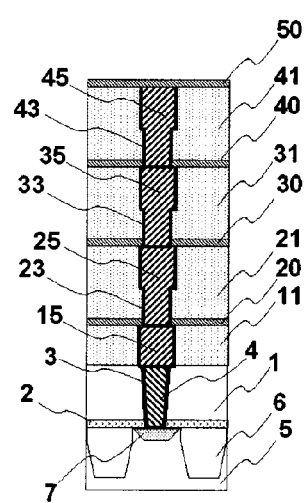
Figure 21:
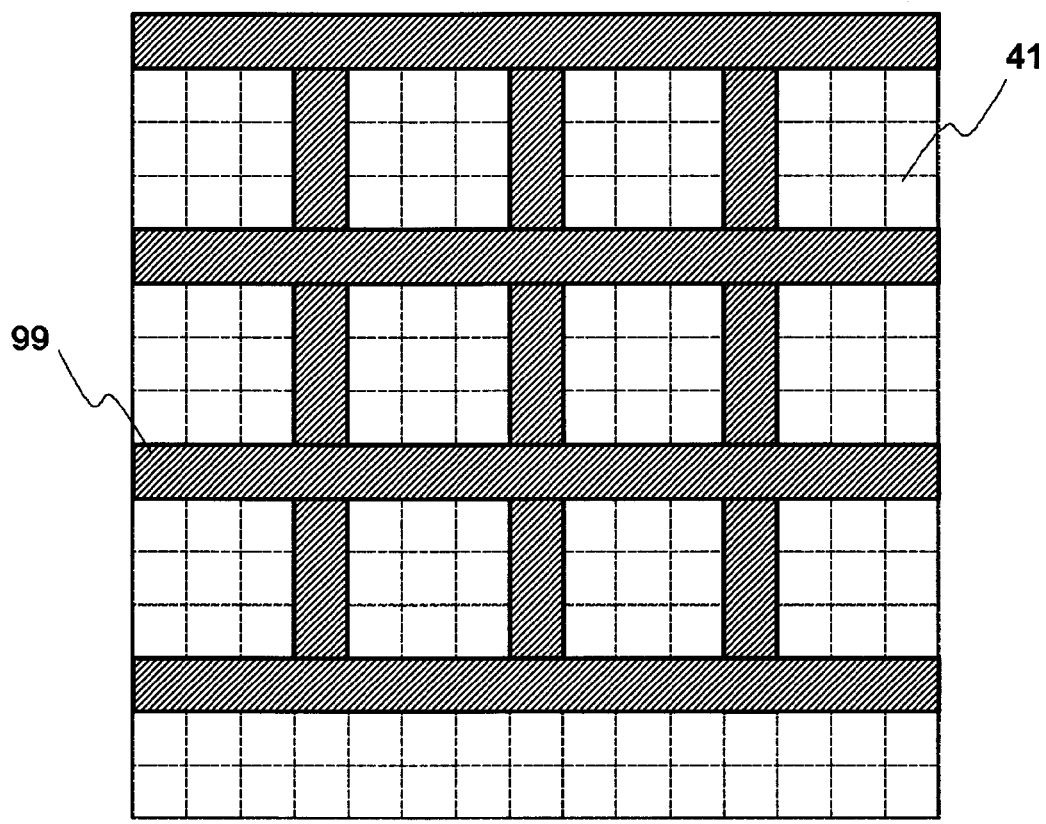
FIG. 21 is a plan view illustrating a layout which appears in the manufacturing process of the semiconductor device illustrated in FIG. 12A, according to one example of the first embodiment of the present invention.

Thereafter, the fourth-layer insulating interlayer 41 is formed (FIGS. 10A and 10B). Since the fourth-layer insulating interlayer 41 will have a difference in the level of height between the memory circuit section and the logic circuit section, due to capacitance elements 90 in the memory circuit section, so that the surface of which is planarized by a technique such as CMP. For the case where filling of the insulating film into the cylindrical openings is difficult, it may also be allowable to fill up the openings 98 for forming capacitance elements by using an insulating interlayer having a good filling performance, etch the insulating interlayer so as to leave it only in the openings 98 for forming capacitance elements, and then the fourth-layer insulating interlayer 41 may be formed. A hard mask-forming insulating film 44, used as a mask for forming the openings (not illustrated) in the fourth-layer interconnect, is then formed (FIGS. 11A and 11B). Thereafter, the fourth-layer interconnect 45 is formed (FIG. 12B), by procedures similar to those for forming the second-layer interconnect 25. A fifth-layer interconnect 55 is then formed, and a fifth-layer interconnect cap film 60 is formed. In this process, in the memory circuit section, the upper electrode (upper electrode film 93) of the capacitance element 90 functions as a stopper against formation of interconnect trenches so as to limit the depth of trenches, and at the same time, the interconnect (plate line interconnect 99) directly connected to the upper electrode is formed. By the plate line interconnect 99, not only the capacitance elements 90 are connected with each other, but also the resistivity between the capacitance elements 90 may be reduced. The plate line interconnect 99, illustrated in FIG. 12A as if being extended in the depth direction, may actually have a mesh-like geometry over the plane in the memory circuit region (FIG. 21). The fifth-layer interconnect 55 is similarly formed, followed by formation of a sixth-layer interconnect 65 on the upper layer, to thereby complete the semiconductor integrated circuit (FIGS. 1A to 1C).

Operations and effects of this embodiment will be explained below.

Since the damascene-structured copper interconnect (second-layer interconnect 25) is provided between the capacitance elements 90 and the MOS transistors 9 in this embodiment, so that the resistivity of the interconnect may be reduced. As a consequence, the semiconductor device excellent in high-speed operability may be obtained.

In addition, since the lower electrode (lower electrode film 91), brought into direct contact with the second-layer interconnect 25 composed of a copper interconnect, is provided with an electro-conductive metal capable of functioning as a barrier against copper diffusion, so that copper diffusion from the copper interconnect may be suppressed. As a consequence, the semiconductor device excellent in reliability of connection may be obtained.

In this embodiment, the thickness (height) of the capacitance element 90 may be made larger than the thickness of a single layer of interconnect layer. On the other hand, the thickness (height) of the capacitance element 90 may be made smaller than the total thickness of two layers of the interconnect layer. In this embodiment, as illustrated in FIG. 1A, the height of the capacitance element 90 is approximately 1.5 times as large as the height of the interconnect layer in the logic circuit section. The height of the capacitance element 90 may typically be set larger than the height of the interconnect layer and smaller than twice the height of the interconnect layer, and more preferably 1.1 times or larger and 1.9 times or smaller. It is not necessary herein to modify the multi-layered interconnect structure of the logic circuit section. In particular, by adopting such penetrative structure through the interconnect layer, a sufficient level of capacitance of the capacitance elements 90 may be ensured, without increasing the height of the interconnect layer. As a consequence, design parameters such as resistivity of the multi-layered interconnect in the logic circuit section may be suppressed from being varied, even if the capacitance elements 90 are embedded therein. Accordingly, by adopting values, which are compatible to both cases with and without the capacitance elements, to the design parameters of the logic circuit when it is designed, also the integrated circuit having the capacitance elements formed on the same substrate may be designed in a simplified manner.

Now the thickness (height) of the capacitance element 90 may be set to a maximum value of distance between the lower surface of the lower electrode film 91 and the upper surface of the upper electrode film 93, when viewed in the direction of perpendicular line fallen on the substrate. On the other hand, the thickness (height) of the interconnect layer may be set to the thickness (height) of a single interconnect, when viewed in the direction of perpendicular line fallen on the substrate (for example, the third-layer interconnect 35 or the fourth-layer interconnect 45 may be adoptable as the interconnect provided in the same layer with the capacitance elements 90).

This embodiment exemplifies the case where all interconnects, enumerated from the first-layer interconnect 15, are composed of copper interconnects, in view of reducing resistivity of the interconnect, as a result of making much account of performances of the logic circuit section. From the viewpoint of reducing resistivity of the interconnect, the material composing the interconnect of the interconnect layer (multi-layered interconnect), which resides at least in the region having the capacitance elements 90 formed therein, preferably contains copper, or is mainly composed of copper. It is more preferable that the copper interconnect (interconnect composed of copper) is adopted to all interconnect layers (excluding so-called pad Al layer). This sort of multi-layered interconnect in the logic circuit section may be adoptable to all interconnects necessary for connection of the embedded capacitance elements 90. Accordingly, in the process of designing the logic circuit section of a so-called, memory-embedded LSI having the memory circuit section and the logic circuit section integrated on a single semiconductor substrate like in this embodiment, it is now possible to use parameters same as those used for designing a general logic LSI having no memory circuit section embedded therein. It may, therefore, be no longer necessary to design the logic circuit section of the LSI having the memory circuit section embedded therein, by a dedicated process.

In this embodiment, at least one layer of damascene-structured copper interconnect (third interconnect 35) is provided between the lower capacitor interconnect (second-layer interconnect 25) connected to the lower electrode (lower electrode film 91) and the upper capacitor interconnect (plate line interconnect 99) connected to the upper electrode (upper electrode film 93). Resistivity of the interconnect may therefore be reduced, and thereby a semiconductor device excellent in high-speed operability may be obtained.

Since the capacitance elements 90 in the memory circuit section are embedded in the multi-layered interconnect structure, so that the distance from the impurity-diffused layer 7 of the MOS transistor 9 in the logic circuit section to the first interconnect layer 15 may be reduced to a large degree as compared with the conventional cases. Accordingly, formation of the semiconductor device may be simplified. At the same time, by reducing the resistance along a route from the impurity-diffused layer 7 to the first interconnect layer 15, parasitic resistivity of the transistor may be reduced, and thereby high-speed operation may be ensured.

Moreover, since it may now be possible to adopt low-k/Cu interconnect characterized by low resistivity and low parasitic capacitance, commonly to the memory circuit section and to the logic circuit section, so that the logic circuit section may completely be prevented from being degraded in the performance, even if the memory circuit section having the capacitance elements formed therein is integrated therewith.

Figure 13A:
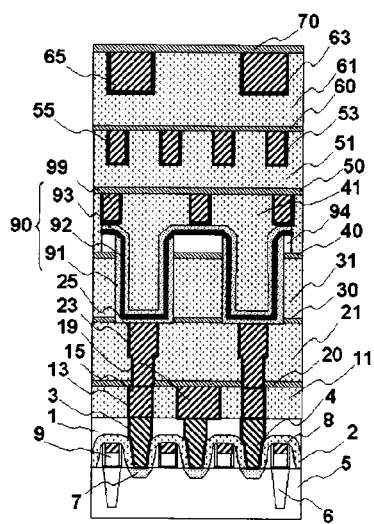
FIGS. 13A to 13C are sectional views illustrating a semiconductor device according to a modified example of the first embodiment of the present invention.
Figure 13B:
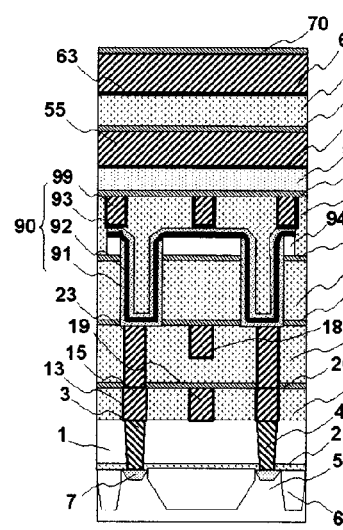
Figure 13C:
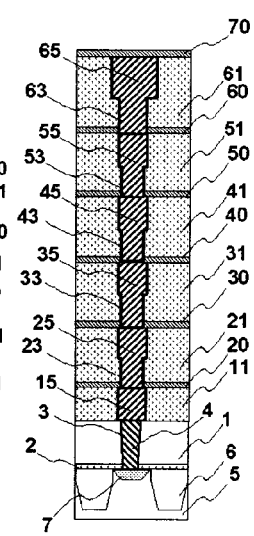
Figure 14A:
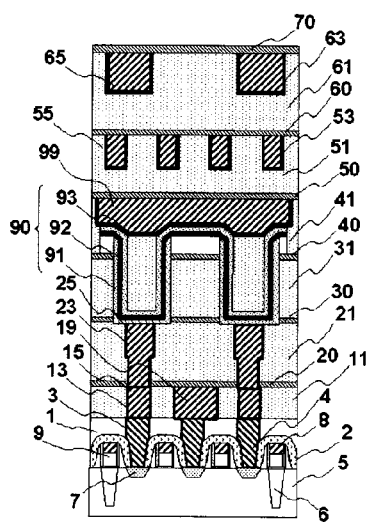
FIGS. 14A to 14C are sectional views illustrating a semiconductor device according to another modified example of the first embodiment of the present invention.
Figure 14B:
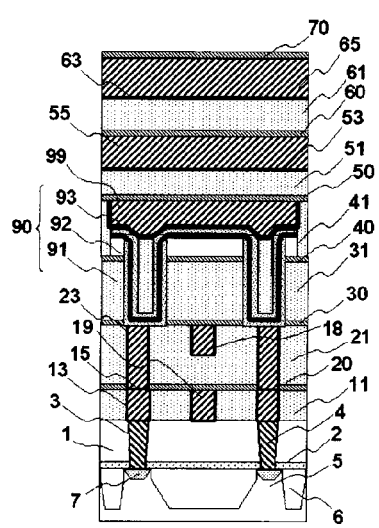
Figure 14C:
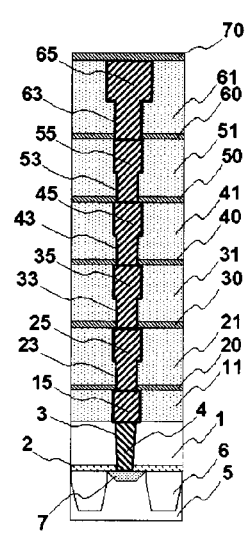

While the insulating interlayer and the cap film in this embodiment described in the above are composed of an MPS film and an SCC film, respectively, the insulating interlayer may alternatively adopt a SiOCH film such as commercialized under the name of Black Diamond, and the cap film may adopt a SiCN film, as illustrated in FIGS. 13A to 13C. In this case, it is necessary to appropriately select the process conditions when the openings for forming capacitance elements are formed, since the compositions of both films are different in terms of presence or absence of nitrogen.

Alternatively, as illustrated in FIG. 14, the plate line interconnect 99 in the memory circuit region may have a pad-like geometry, just like an ultra-wide interconnect, rather than the thin line geometry. Still alternatively, a slit wide interconnect geometry, having slits in places, may also be adoptable.

Next, effect of this embodiment will further be explained, in comparison with the prior art.

As has been described in the above, the techniques described in the prior art documents have adopted high-resistivity tungsten (W) to the interconnects between the capacitance elements and the transistors, from the viewpoint of reliability, and have occasionally been resulted in lowering in the operation speed of the logic circuit as a consequence. In particular for an exemplary case described in Patent Document 3, where the first-layer interconnect, right above which the lower electrode of the capacitance element is connected, is simply composed of a copper interconnect, copper may diffuse through the lower electrode into the capacitor insulating film, to thereby degrade characteristics of the capacitance element.

In contrast, according to this embodiment, the damascene-structured copper interconnect (second-layer interconnect 25) is provided between the capacitance element 90 and the MOS transistor 9, and the lower electrode (lower electrode film 1), which is brought into direct contact with the second-layer interconnect 25 composed of a copper interconnect, is provided with an electro-conductive metal capable of functioning as a barrier against copper diffusion. With this structure, degrading characteristics of the capacitance element is suppressed. Accordingly, the semiconductor device excellent both in high-speed operability and reliability of connection may be obtained.

In the field of technologies of manufacturing integrated circuits in recent electronics industry, there has been a growing demand for still larger degree of integration and faster operational speed. Advancement of the integration has, however, increased the magnitude of circuit, and has increased difficulty n the design. A so-called mixed circuit, which means an integrated circuit having an logic circuit and a memory circuit mounted on a single semiconductor substrate, is characterized not only by an increased degree of integration simply by virtue of close proximity of the logic circuit and the memory circuit arranged on the same substrate, but also by an improved operational speed by virtue of shortened interconnects between the circuits.

However, arrangement of the logic circuit and the memory circuit having the capacitance elements on the same semiconductor substrate raises another need of adopting a structure, which is unnecessary for forming general logic circuit, due to capacitance elements owned by the memory circuit for the purpose of storing data. For example, as for trench-type capacitance elements, a known technique ever reported is such as forming trenches to as deep as several micrometers or more in a semiconductor substrate, wherein difficulty in the manufacturing process has extremely been increasing, not only due to shrinkage of diameter of the trenches which advances with shrinkage of the elements, but also due to need of ensuring a necessary level of capacitance.

On the other hand, stack-type capacitance elements have adopted stack structures such as those of fin-type or cylinder type, in order to satisfy desired levels of capacitance. In the so-called COB (Capacitor Over Bit line) structure, having the capacitance elements formed over the bit lines, it is necessary to increase the height of the capacitance elements in order to ensure a sufficient level of capacitance.

Increase in the height of the stack structures, however, means that the interconnects in the lower portion of the capacitance elements are brought apart from the interconnects in the upper portion of the capacitance elements. This consequently increases also the height of contacts in the logic circuit section, measured from the first interconnect layer to the impurity-diffused layers, so that the manufacturing process may add difficulty, and the semiconductor device may be degraded in the operational speed, due to increase in electric resistance, or parasitic resistance, of the layer having the capacitance elements formed therein.

Moreover, as has been described in the above, it is necessary to design the logic circuit, to be integrated with the memory circuit on the same semiconductor substrate, taking the parasitic resistance into consideration, in association with formation of the capacitance elements. This means necessity of modification of design parameters depending on presence or absence of capacitance elements on the same semiconductor substrate, in particular depending on difference in the interconnect resistance and parasitic capacitance, even if the logic circuit to be designed would be the same. More specifically, even the same logic circuit has to be re-designed only because it is formed at the same time with the capacitance elements. In some cases, it may even be anticipated that the operational speed of the circuit will degrade as a result of integration with the capacitance elements, or the circuit will be no longer operable due to narrowed operational margin.

(1) As has been described in the above, according to the technique described in Patent Document 1 (Japanese Laid-Open Patent Publication No. 2007-201101), the height of contact may be reduced, but the design needs parameters specialized for the capacitance elements, not compatible with design parameters of general logic circuit in which all interconnect layers are composed of low-resistivity copper. For more details, according to the technique described in Patent Document 1, the lower surface of the capacitance element is located above the upper surface of the lower capacitor interconnect, so that the height of connection, measured from the lower electrode of the capacitance element to the impurity-diffused layer, is larger than the thickness of the lower capacitor interconnect. In addition, the structure of the interconnect layer having the capacitance element formed therein is different from the interconnect structure of the general logic circuit, characterized in that the layer having the capacitance elements formed therein has larger height of logic contact, and larger resistivity. As a consequence, it is inevitably necessary to use design parameters of the logic circuit, specialized for the capacitance elements.

Note that, according to the technique described in Patent Document 1, a range of reduction in the height of contact in the logic circuit section is limitative, which is equivalent to the height of a single layer of interconnect.

(2) Even with the structure described in Patent Document 2 (Japanese Laid-Open Patent Publication Nos. 2004-342787), it is necessary to use dedicated parameters of the logic circuit, if the logic circuit is designed to be integrated with the memory circuit. For more details, even with the technique described in Patent Document 2, the structure of the logic circuit section depends on the structure of the capacitance elements, which is different from the structure having no capacitance elements. Similarly as described in Patent Document 1, the lower surface of the capacitance element is located above the upper surface of the lower capacitor interconnect composed of W, so that the height of connection, measured from the lower electrode of the capacitance element to the impurity-diffused layer, is larger than the thickness of the lower capacitor interconnect. As a consequence, it is inevitably necessary to use design parameters of the logic circuit, specialized for the capacitance elements.

In addition, since not all of the interconnects in the memory circuit section are composed of copper interconnects, so that not all of the multi-layered interconnects again in the logic circuit section are composed of copper interconnects. It is, therefore, inevitable to cause increase in difficulty of contact formation, and increase in contact resistance, just as described in Patent Document 1. Moreover, the multi-layered interconnect of state-of-the-art logic circuits has adopted a low-k insulating interlayer such as a SiOCH film, at least in a narrow-pitch local interconnect positioned in the lower portion thereof. The low-k insulating interlayer (low-k film) has, however, only a limited level of heat resistance, and may therefore not be combined with W interconnects typically grown by CVD at high temperatures. For this reason, it is not possible to configure all layers in the multi-layered interconnect in the logic circuit section, using low-k/Cu interconnect structure. As a consequence, such logic circuit section inevitably needs dedicated design parameters which are not compatible with parameters for designing general logic circuit having all interconnect layers configured by the low-k/Cu structure.

(3) Also with the technique described in Patent Document 3 (Japanese Laid-Open Patent Publication No. 2008-251763), the design parameters of the logic circuit, specialized for the capacitance elements are necessary. For more details, according to the document, the lower electrode of the capacitance element is connected right above the first-layer interconnect. However, no consideration is paid on formation of the memory circuit and the state-of-the-art logic circuit on the same semiconductor substrate. Accordingly, for an exemplary case where the capacitance elements reside on the same semiconductor substrate, design parameters will necessarily be modified, because it is anticipated that the operational speed of the logic circuit would degrade due to interconnect resistance ascribable to the height of capacitance elements, or the circuit would be no longer operable due to narrowed operational margin.

In addition, it is essential on the design basis to use low-resistivity copper interconnect for the multi-layered interconnect, when the memory circuit is integrated with the state-of-the-art logic circuit. Use of the tungsten-containing interconnect for the interconnect in the logic circuit, as described in Patent Document 3, has still resulted in lowered operational speed of the logic circuit or narrowed operational margin, and has inevitably needed modification of the design parameters.

In contrast to the related arts (1) to (3) described in the above, in the semiconductor integrated circuit device of this embodiment, having the memory circuit section provided with the capacitance elements and the logic circuit section formed on the same semiconductor substrate, the capacitance elements are embedded in the insulating interlayers which electrically isolate the multi-layered interconnect formed in the logic circuit section, especially in the region thereof extending over at least a plurality of interconnect layers, to thereby configure all of the interconnects necessary for connection of the capacitance elements using the multi-layered interconnect of the logic circuit section. By this configuration, the design parameters of the logic circuit section may be totally matched to those of the semiconductor integrated circuit device having no memory circuit section. In addition, by reducing the distance between the impurity-diffused layer of the transistor and the first interconnect layer to a large degree, by facilitating formation of this structure, and at the same time by reducing the resistivity, the semiconductor device characterized by small parasitic resistance of the transistors and high-speed operability may be provided. It is also made possible to provide a insulating interlayer structure, which appropriately allows formation of the capacitance elements in the insulating interlayers which electrically isolate the multi-layered interconnect formed in the logic circuit section, especially in the region thereof extending over at least a plurality of interconnect layers.

The present inventors found out, from our extensive investigations aimed at achieving the above-described configuration, that it is very effective for the semiconductor integrated circuit device, having the memory circuit section provided with the capacitance elements and the logic circuit section formed on the same semiconductor substrate, to ensure the parameters for designing interconnects totally compatible with those for the semiconductor integrated circuit device composed of the logic circuit section only, and to embed the capacitance elements in the insulating interlayers which electrically isolate the multi-layered interconnect formed in the logic circuit section, especially in the region thereof extending over a single or less than two interconnect layers, so as to configure all of the interconnects necessary for connection of the capacitance elements using the multi-layered interconnect of the logic circuit section.

According to embodiment 1 or embodiment 3 in Patent Document 2, the insulating film composed of a silicon oxide film is formed right above the upper electrode and upper-layer interconnect composed of copper film. However, since the silicon oxide film is not durable against diffusion of copper, so that the structure described in Patent Document 2 allows diffusion of copper (Cu) into the insulating film, enough to degrade the reliability of the insulating film. In addition, since the silicon oxide film is formed mainly based on oxidation of source gas, so that formation of the silicon oxide film, proceeded over the surface of the interconnect where Cu exposes, may result in oxidation of Cu, and consequently in increase in the interconnect resistance, degraded adhesiveness with the thus-grown silicon oxide film, and degradation in the reliability associated therewith. As may be understood from the above, although Patent Document 2 claims an advantage of needlessness of the etching stopper film, the structure described in Patent Document 2 is conversely supposed to be disadvantageous in terms of degradation in the reliability.

In contrast, in this embodiment, the cap film is composed of an SCC film durable against diffusion of copper. By virtue of this configuration, the semiconductor device, which is successfully suppressed in the diffusion of copper contained in the copper film composing the upper electrode and the upper-layer interconnects, and is therefore highly reliable, may be provided.

According to the related art described in the above, as illustrated in FIGS. 28A and 28B, since an add-on-type memory circuit section 101 is configured to have a multi-layered interconnect portion 103 "added on" the capacitance element 90, so that it is necessary for an add-on-type logic circuit section 102 to adopt an interconnect portion (lift-up interconnect portion 104) for lifting up the multi-layered interconnect portion 103 corresponding to the height of the capacitance element 90. The lift-up interconnect portion 104 is, however, not only difficult to form due to its large aspect ratio, but is also high in resistivity. Accordingly, this not only makes the design parameters of the add-on-type logic circuit section 102 having the lift-up interconnect portion 104 largely depart from those of a logic circuit section having no lift-up interconnect portion, but also degrade performances of the add-on-type logic circuit section 102. Formation of the lift-up interconnect portion 104 will be predicted to be more difficult as the shrinkage of the device further advances.

In contrast, in this embodiment, as illustrated in FIGS. 29A to 29C, since the memory circuit section and the logic circuit section are configured to give a built-in-type memory circuit section 105, a built-in-type logic circuit section 106, and a built-in-type memory circuit section 107, all of which having the capacitance element 90 embedded in the multi-layered interconnect structure, so that the design parameters of the built-in-type logic circuit section 106 will not vary as a result of presence of the capacitance elements 90. Since the structure and materials of the multi-layered interconnect in the logic circuit section totally remain unchanged as described in the above, even if the built-in-type memory circuit section 105 co-exists on the same semiconductor substrate, so that the design parameters, totally compatible with those used for the case having the logic circuit section only, may be adoptable.

In other words, a mixed circuit chip of this embodiment, composed of the memory circuit section having the capacitance elements and the logic circuit section, can exhibit high-speed memory function, while keeping logical operation performance fully equivalent to that of a general logic circuit chip having the logic circuit section only.

Second Embodiment

Figure 15A:
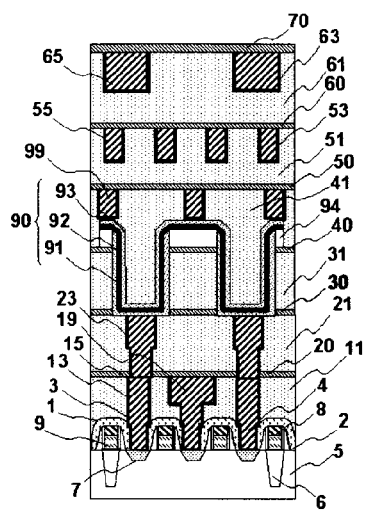
FIGS. 15A to 15C are sectional views illustrating a semiconductor device according to one example of a second embodiment of the present invention.
Figure 15B:
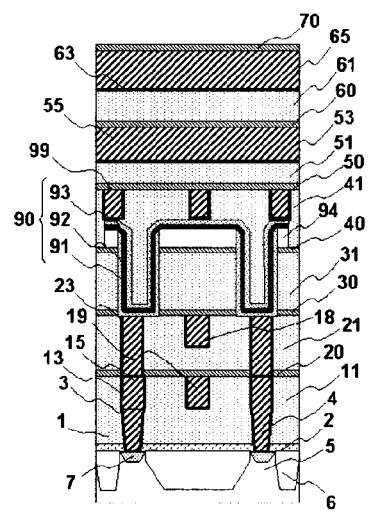
Figure 15C:
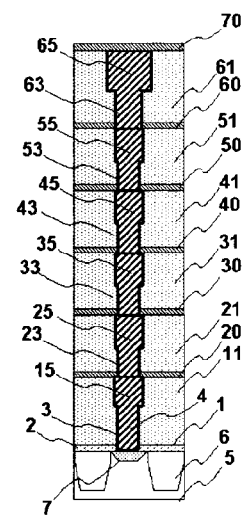

FIGS. 15A to 15C are sectional views illustrating a semiconductor device of a second embodiment.

Again among these drawings, FIG. 15A on the left and FIG. 15B at the center are sectional views of the memory circuit region taken in the directions normal to each other. FIG. 15C on the right is a representative sectional view of the logic circuit region.

In the semiconductor device of the second embodiment, there are at least two layers of damascene-structured copper interconnects (the first-layer interconnect 15 and the second-layer interconnect 25) formed as the interconnect layers (first interconnect layer and second interconnect layer) below the capacitance elements 90. By thus adopting copper for composing the contact plugs 4, and by further forming the first-layer interconnect 15 and the dual-damascene structure (dual-damascene contact structure) in addition to the structure of the first embodiment, the resistance along a route from the impurity-diffused layer 7 to the first interconnect layer 15 may further be reduced.

While the contact-forming insulating interlayer 1 herein may be composed of a silicon oxide film as illustrated in FIGS. 2A and 2B, this embodiment adopts MPS, similarly to the first-layer interconnect layer. Alternatively, a low-k SiOCH film of still other species, different from the first interconnect layer, may be adoptable to the contact-forming insulating interlayer 1. Still alternatively, a stacked structure of different species of low-k SiOCH films may be adoptable. The contact-forming insulating interlayer 1 is preferably configured by using a film having a barrier performance against Cu diffusion, such as the above-described SCC film, for example. The stacked structure is preferably used in the lowermost layer, that is, right above the etching stopper film.

In particular, the SCC film, which is formed by plasma polymerization, shows step coverage better than that shown by the insulating interlayer formed by general plasma CVD, and may therefore exhibit a good filling performance over a surface irregularity ascribable to presence of the gates, such as over the etching stopper film formed on the semiconductor substrate (silicon substrate 5).

In addition, in this embodiment, copper is adopted also as a material for composing the contact plugs 4. By adopting copper for all interconnect metals including the plugs and vias, including the contact plugs 4 (but excluding so-called pad Al layer), this embodiment successfully reduces the resistivity, enough to claim itself as one of very preferable embodiment.

Since a contact barrier 3 of the contact plugs 4 in the structure of this embodiment functions also as the first-layer interconnect barrier metal film 13 of the first-layer interconnect 15, and is formed by the dual-damascene process as described in the above, so that it is preferably a barrier film having a large durability against copper diffusion and low resistivity. Among the above-described metal films adoptable to the barrier metal, preferable examples include tantalum nitride, stacked structure of tantalum/tantalum nitride, and stacked structure of ruthenium/titanium.

Third Embodiment

Figure 22:
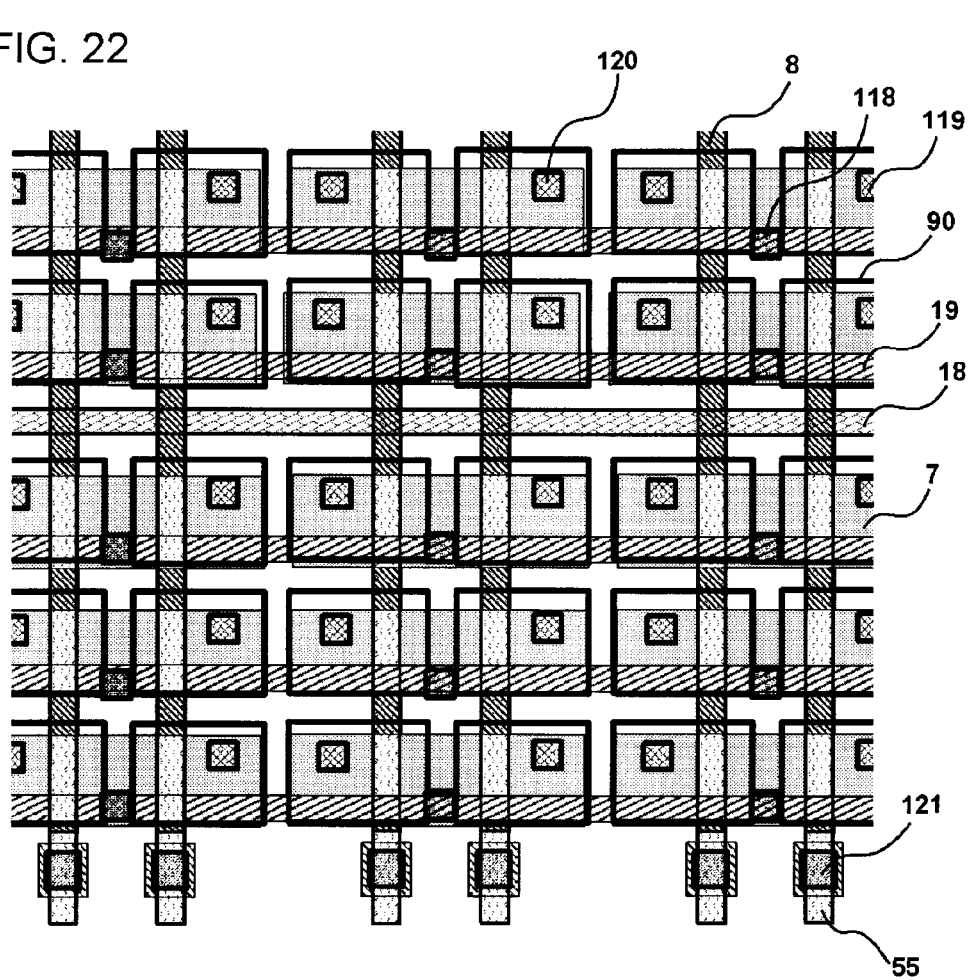
FIG. 22 is a plan view illustrating a layout of a semiconductor device, according to one example of a third embodiment of the present invention.
Figure 23:
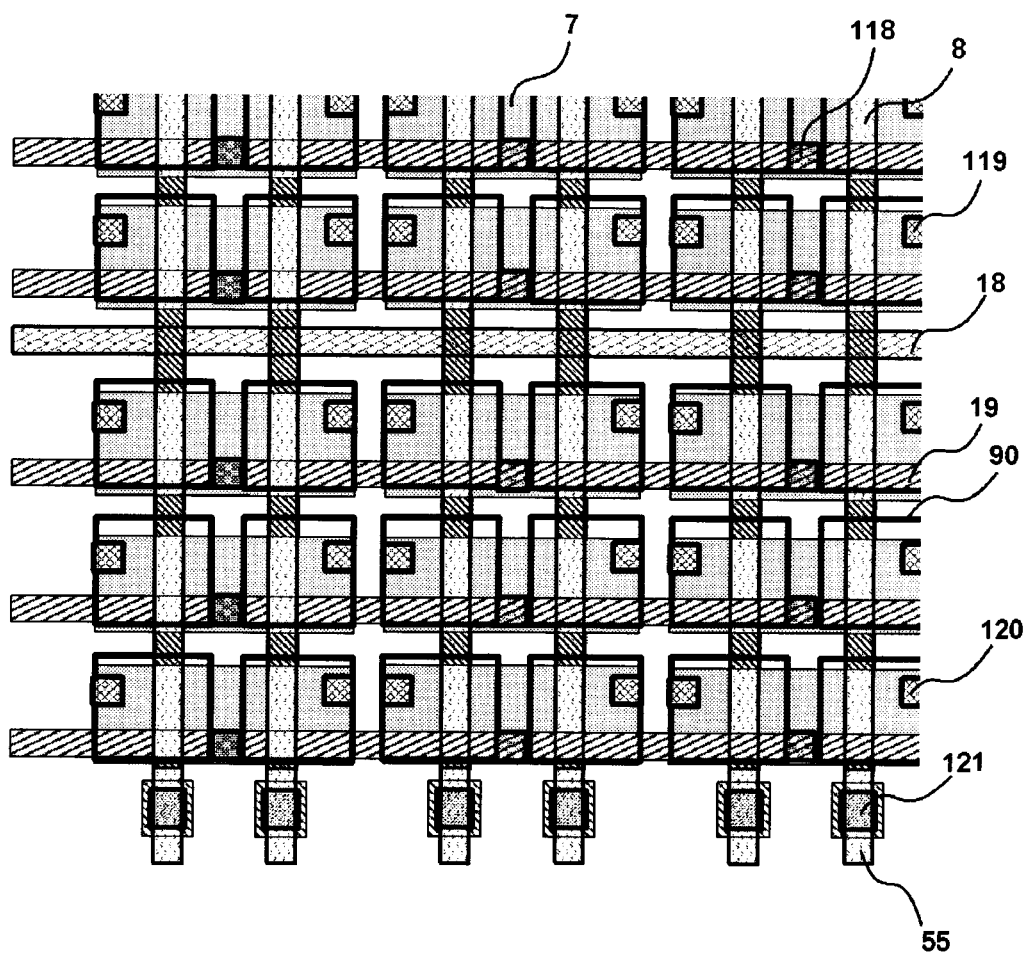
FIG. 23 is a plan view illustrating a layout of a semiconductor device, according to another example of the third embodiment of the present invention.

FIG. 22 and FIG. 23 are drawings illustrating planar layouts of a semiconductor device of a third embodiment. In this embodiment, an embedded DRAM region of the semiconductor device (which means a memory region in a single chip having the memory region and a logic region integrated therein) is configured by the gate electrodes which serve as the word lines, the interconnect layers which serve as the bit lines, the impurity-diffused layers, and the capacitance elements, all of which being formed to have quadrilateral (square or rectangular) geometries in a plan view (top view of the device).

Each drawing illustrates a representative structure of the memory circuit region in the third embodiment. Note that a part of the interconnects, including the plate lines 117 in particular, is not illustrated for simplicity of explanation below.

In the semiconductor device of the third embodiment, two layers of copper interconnect provided below the capacitance elements 90 contain the bit lines and the column decoding interconnects of the memory elements.

The gate electrodes 8 which serve as the word lines, and the column decoding lines 18 cross normal to each other. The bit lines 19 are formed into a straight-line geometry, in parallel with the column (Y) decoding lines 18. Each cylindrical capacitance element 90 has a quadrilateral geometry in a plan view (FIG. 22 or FIG. 23). In this embodiment, a single column decoding line 18 is arranged per every three bit lines 19. The ratio of the number of bit lines 19 and column decoding lines 18 may alternatively be 4:1, or 5:1, or still larger. In this embodiment, processes of manufacturing such as exposure of light or patterning may be facilitated, by forming the bit lines 19 into a linear (quadrilateral) geometry in a plan view, and further by forming the cylindrical capacitance elements 90 again into the quadrilateral geometry in a plan view.

Figure 24:
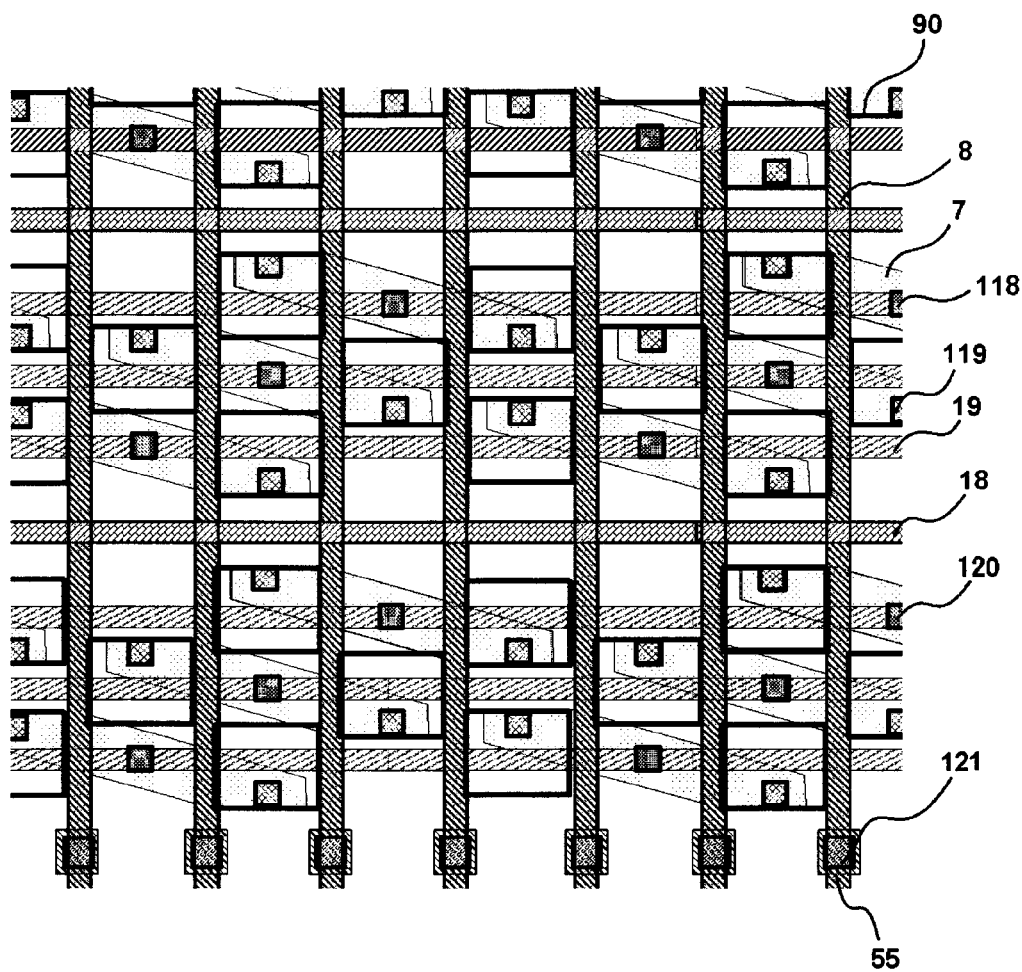
FIG. 24 is a plan view illustrating a layout of a semiconductor device, according to a modified example of the third embodiment of the present invention.

FIG. 24 is a drawing illustrating a planar layout according to a modified example of the third embodiment.

In the modified example of the third embodiment, all of the gate electrodes which serve as the word lines, the interconnect layers which serve as the bit lines, and the capacitance elements in the embedded DRAM region of the semiconductor device are formed to have quadrilateral (square or rectangular) geometries in a plan view, and the impurity-diffused layers have a deformed hexagonal geometry extended while being inclined from the direction of extension of the bit lines 19 (FIG. 24).

In the modified example of the third embodiment, two layers of the copper interconnects provided below the capacitance elements 90 contain the bit lines and interconnects used for strapping the word lines (in other words, word strap interconnects) of the memory elements. As illustrated in FIG. 24, the fifth-layer interconnect 55 which serves as a so-called word strap interconnect used for reducing resistance of the word lines, and word line contacts 121 used for establishing contact with the word lines, are provided in the outer circumference of the memory circuit region.

Each word line contact 121, only a planar structure of which is illustrated in FIG. 22 and FIG. 23 in a plan view, is actually connected in the logic circuit region to the gate electrode 8, through the stacked vias configured by the fifth-layer interconnect 55 to the first-layer interconnect 15, and further through the contact plugs 4, as illustrated in FIG. 24. Each word line contact 121 is formed per a predetermined number of bit lines. For example, each word line contact 121 is formed in the outer circumference of the memory circuit region per every 16 lines, 256 lines, 512 lines or larger number of lines of bit lines.

Figure 26A:
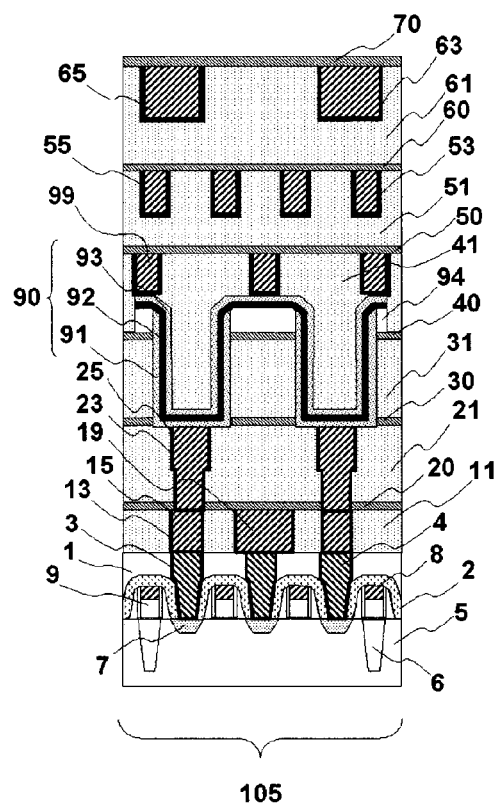
FIGS. 26A and 26B are sectional views illustrating a semiconductor device according to the third embodiment of the present invention.
Figure 26B:
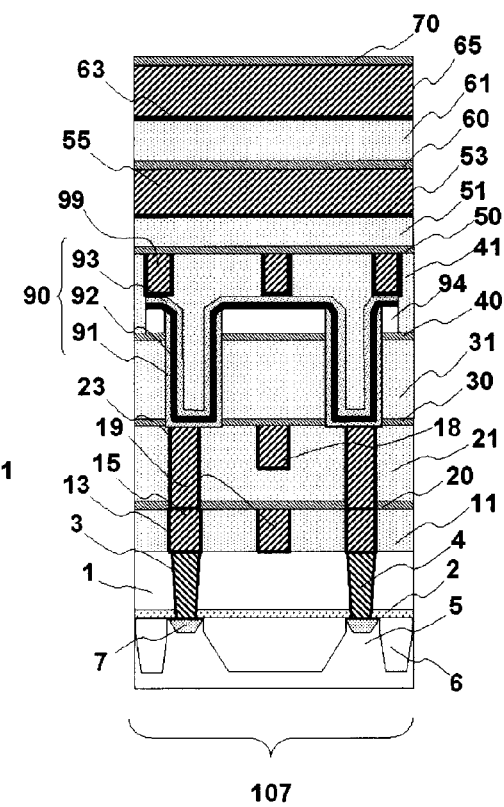
Figure 27:
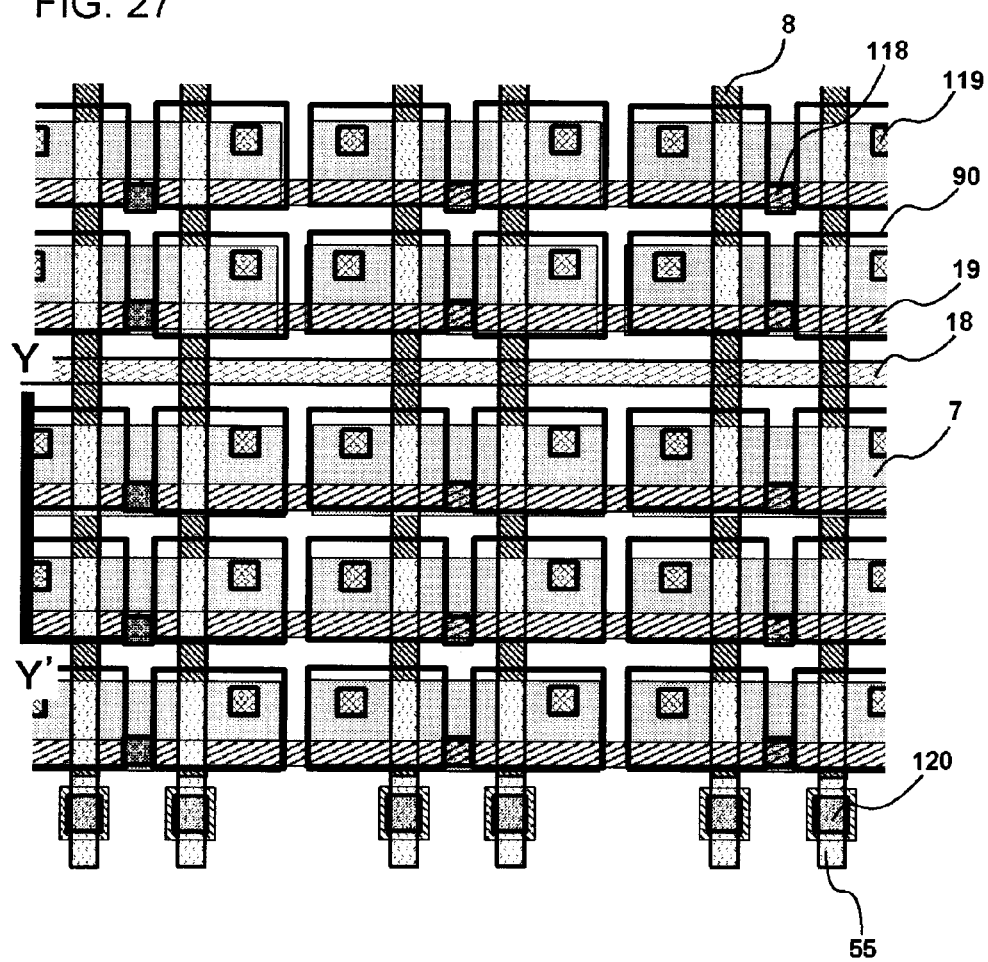
FIG. 27 is a plan view illustrating a layout of a semiconductor device, according to one example of the third embodiment of the present invention.

FIG. 27 is a drawing illustrating a relation between the sectional view in FIG. 26A, corresponded to FIG. 1A explained in the first embodiment, and the planar layout in this embodiment illustrated in FIG. 22. FIG. 26B on the right illustrates a structure of the built-in-type memory circuit section 107, taken along line Y-Y' in FIG. 27. FIG. 27 illustrates only a part of constituents of FIG. 26A for simplicity of explanation.

In the semiconductor device structure of the third embodiment, at least two layers of the copper interconnects, out of the multi-layered interconnect in embedded DRAM region, are formed in the interconnect layers below the capacitance element 90. Two layers of the copper interconnects formed in the interconnect layers below the capacitance elements 90 may be configured as the bit lines 19 and the column (Y) decoding lines 18. Alternatively, two layers of the copper interconnects formed in the interconnect layers below the capacitance elements 90 may be configured as the bit lines 19 and the word strap interconnects. Still alternatively, two layers of the copper interconnects formed in the interconnect layers below the capacitance elements 90 may be configured as the column (Y) decoding lines 18 of the memory elements and the word strap interconnects.

Accordingly, by forming at least two or more copper interconnects between the lower surface of the lower electrode of the capacitance elements 90 and the semiconductor devices (MOS transistor 9), the upper surface of one of these interconnects are aligned in the same plane with the lower surface of the capacitance elements, and thereby the number of layers necessary for composing the multi-layered interconnect structure in the memory circuit section may be reduced, the height thereof may be reduced to a large degree, and formation thereof may be facilitated.

Fourth Embodiment

Figure 25:
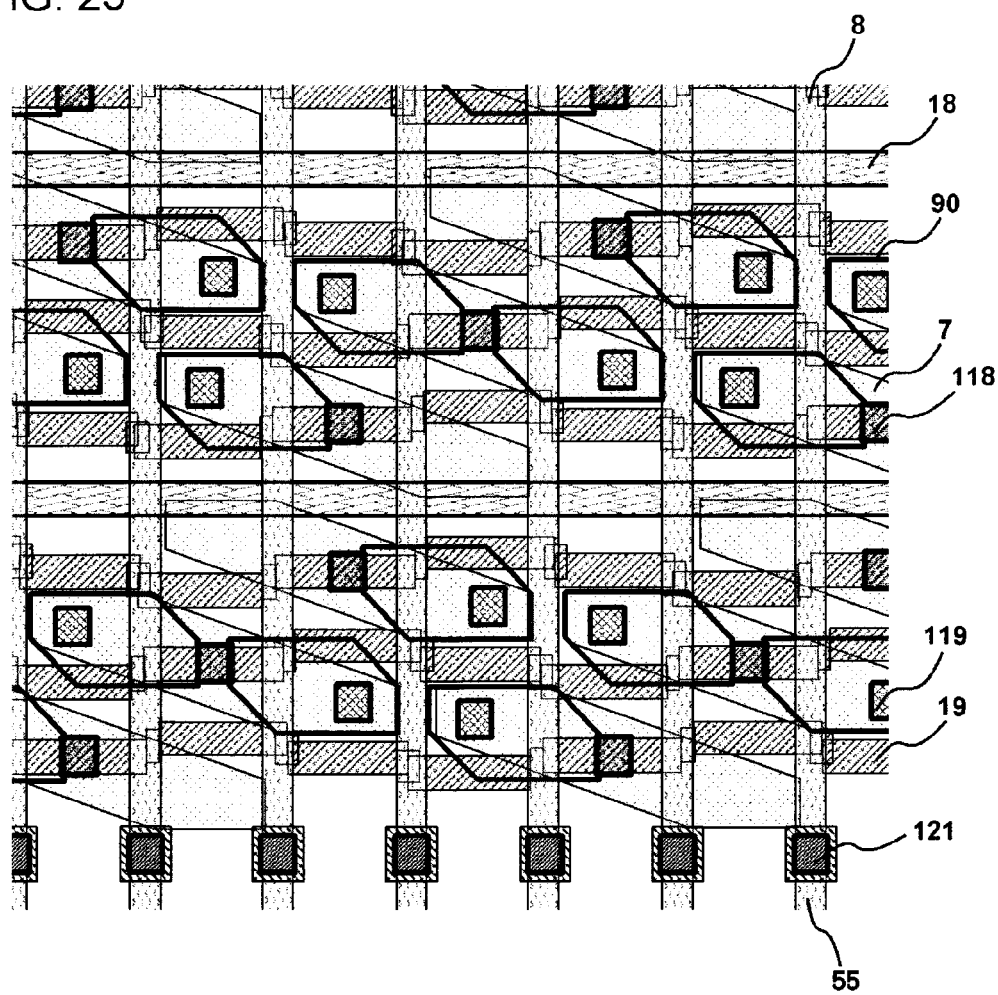
FIG. 25 is a plan view illustrating a layout of a semiconductor device, according to one example of a fourth embodiment of the present invention.

FIG. 25 is a drawing illustrating a planar layout in the embedded DRAM region of the semiconductor device of a fourth embodiment.

In the semiconductor device of the fourth embodiment, the gate electrodes which serve as the word lines are formed into a quadrilateral (square or rectangular) geometry in the plan view, the impurity-diffused layers and the capacitance elements are formed into deformed hexagonal geometries extended while being inclined from the direction of extension of the bit lines 19, and the bit lines 19 between every adjacent word lines are connected while being slightly shifted (staggered) in the width direction of the bit lines 19.

FIG. 25 illustrates a representative structure of the elements in the memory circuit region in the fourth embodiment. Note that a part of the interconnects, including the plate lines 117 in particular, is not illustrated for simplicity of explanation below.

FIG. 25 illustrates an exemplary planar layout having the impurity-diffused layers 7 inclined from the bit lines 19, in comparison with the layout illustrated in FIG. 22 or FIG. 23, to thereby form them into a deformed hexagonal geometry close to parallelogram. In this embodiment, the number of bits per unit area may be increased, by forming the impurity-diffused layer 7 into a deformed hexagonal geometry. Introduction of such oblique geometry into a layout pattern may, however, make the manufacturing processes, such as exposure of light, more complicated.

In this embodiment, the gate electrodes 8 which serve as the word lines, and the column decoding lines 18 cross normal to each other. The bit lines 19 are formed in parallel with the column (Y) decoding lines 18, but partially in the oblique direction so as to be routed around capacitor contacts 119 and bit line contacts 118. Note that, such oblique portions are not illustrated in FIG. 25, since they are hidden under the fifth-layer interconnect 55. While a single column decoding line is arranged per every three bit lines 3 in this embodiment, the ratio of the number of the bit lines and the column decoding lines may alternatively be 4:1, or 5:1, or still larger.

The number of bit per unit area may be increased by inclining the impurity-diffused layers 7 with respect to the bit lines 19 so as to form them into the deformed hexagonal geometry close to parallelogram, and by forming also the cylindrical capacitance element 90 again into the deformed hexagonal structure in the plan view. FIG. 25 illustrates a layout having the fifth-layer interconnect 55, which serves as the so-called word strap interconnects for reducing resistance of the word lines, and the word line contacts 121 used for establishing contact with the word lines, provided in the outer circumference of the memory circuit region. FIG. 25 illustrates only a planar structure of word line contact 121 in a plan view. Each word line contact 121 is actually connected, just like in the logic circuit region of the third embodiment, to the gate electrode 8, through the stacked vias configured by the fifth-layer interconnect 55 to the first-layer interconnect 15, and further through the contact plugs 4. Each word line contact 121 is formed per a predetermined number of bit lines, and may typically be formed in the outer circumference of the memory circuit region per every 16 lines, 256 lines, 512 lines or larger number of lines of bit lines.

The embodiments of the present invention have been descried referring to the attached drawings, merely for exemplary purposes, while allowing adoption of any other various configurations other than those described in the above.

Now, the terms used in this patent specification will be explained.

The insulating film refers to a film (insulating interlayer) for electrically isolating the interconnect materials. The low-k insulating film refers to a film composed of a material having a dielectric constant smaller than that of silicon oxide film (dielectric constant=4.5), used for reducing capacitance between the multi-layered interconnects which connect the semiconductor elements. In particular, materials for composing the porous insulating film may be exemplified by porous silica materials obtained by converting a silicon oxide film into the porous one to thereby reduce the dielectric constant, HSQ (hydrogen silsesquioxane) film, and materials obtained by converting SiOCH or SiOC (such as Black Diamond™, Aurora™) into the porous ones to thereby reduce the dielectric constant. These films are desired to be further reduced in the dielectric constant.

In this embodiment, materials for composing the metal interconnects and the contact plugs are mainly composed of Cu. For the purpose of improving the reliability of the metal interconnects, the components composed of Cu may contain metal elements other than Cu, or may have metal elements other than Cu formed on the top surface or side faces thereof. In some embodiments, the contact plugs used for connecting the first-layer interconnect and the MOSFETs formed on the silicon substrate may be mainly composed of tungsten (W). In this case, a silicon oxide film having an excellent heat resistance is adoptable to a pre-metal dielectric (PMD) used for electric isolation between the first-layer interconnect and the MOSFETs formed on the silicon substrate.

The barrier metal film is an electro-conductive film having a barrier performance against diffusion of copper, and is provided so as to cover the side faces and bottom surfaces of the interconnects, aiming at preventing the metal elements which compose the interconnects or contact plugs from diffusing into the insulating interlayers or lower layers. For an exemplary case where the interconnects are mainly composed of Cu, the barrier metal may be composed of refractory metals or nitrides thereof, such as tantalum (Ta), tantalum nitride (TaN), titanium (Ti), titanium nitride (TiN), tungsten carbonitride (WCN), ruthenium (Ru), and stacked films of these materials. The above-described metal films may be adoptable also to the barrier metal for the contact plugs mainly composed of tungsten.

The damascene-structured interconnect refers to an embedded interconnect formed by filling a metal interconnect material into a trench preliminarily formed in an insulating interlayer, and then by removing an excessive portion of the metal which resides outside the trench, typically by CMP. For an exemplary case where the damascene-structured interconnect is configured by Cu, an interconnect structure generally adopted is such as covering the side faces and outer circumference of the Cu interconnect with a barrier metal, and such as covering the top surface of the Cu interconnect with an insulating barrier film (also referred to as "cap film") having durability against diffusion of copper (Cu barrier performance).

CMP (Chemical Mechanical Polishing) process refers to a method of planarizing irregularity over the wafer surface produced in the process of forming the multi-layered interconnect, by polishing the wafer surface under contact with a rotating polishing pad, while supplying a polishing slurry over the wafer surface. In the process of forming the interconnects based on the damascene process, the CMP process is adopted particularly for removing an excessive portion of metal used for filling up interconnect trenches or via holes, so as to obtain a flat surface of the interconnects.

The semiconductor substrate refers to a substrate having semiconductor devices configured thereon, and includes not only those built up on a single-crystalline silicon substrate, but also SOI (Silicon On Insulator) substrate, TFT (Thin Film Transistor) substrate, and those used for manufacturing liquid crystal display devices.

The hard mask refers to an insulating film formed over the insulating interlayer so as to protect it, when it is supposed to be difficult to directly subject the insulating interlayer to plasma etching or CMP, due to reduced mechanical strength or process durability of the insulating interlayer as a result of the low-k strategy.

Plasma CVD refers to a technique typically such as continuously feeding gaseous source materials into a reaction chamber kept under a reduced pressure, raising a plasma of the gaseous source materials, and forming a continuous film over the substrate based on vapor phase reaction, or surface reaction on the substrate, of the excited species.

PVD process refers to techniques including not only general sputtering, but also highly-directional sputtering aimed at improved filling performance, improved film quality, or improved in-plane uniformity of the film, such as long throw sputtering, collimated sputtering and ionized sputtering. A resultant film may be given in a form of alloy film, if a metal target is preliminarily added with some metal other than the major constituent, up to an amount not exceeding the solid solubility limit thereof. In the present invention, the PVD process may be adoptable typically so as to form a Cu seed layer for forming the damascene-structured Cu interconnect, or to form the barrier metal layer.

It is apparent that the present invention is not limited to the above embodiments, that may be modified and changed without departing from the scope and spirit of the invention.

What is claimed is:
1. A semiconductor device comprising:
 a semiconductor substrate having a transistor formed thereon;

a multi-layered interconnect formed on said semiconductor substrate, and having a plurality of interconnect layers, respectively composed of an interconnect and an insulating film, stacked therein;

a capacitance element having a lower electrode, a capacitor insulating film, and an upper electrode, all of which being embedded in said multi-layered interconnect, so as to compose a memory element;

at least one layer of damascene-structured copper interconnect formed between said capacitance element and said transistor;

the upper surface of one of said interconnects and the lower surface of said capacitance element being aligned nearly in the same plane; and at least one layer of copper interconnect being formed over said capacitance element.

2. The semiconductor device as claimed in claim 1, wherein said lower electrode of said capacitance element contains an electro-conductive metal capable of functioning as a barrier against copper diffusion.

3. The semiconductor device as claimed in claim 2, wherein said lower electrode directly contacts with said damascene-structured copper interconnect.

4. The semiconductor device as claimed in claim 1, wherein at least one layer of said interconnect is provided between a lower capacitor interconnect connected to said lower electrode and an upper capacitor interconnect connected to said upper electrode, and said interconnect is a damascene-structured copper interconnect.

5. The semiconductor device as claimed in claim 1, wherein at least two layers of said damascene-structured copper interconnect are formed in said interconnect layers below said capacitance element.

6. The semiconductor device as claimed in claim 1, wherein said capacitance element is thicker than said interconnect layer.

7. The semiconductor device as claimed in claim 1, wherein thickness of said capacitance element is smaller than the total thickness of two layers of said interconnect layer.

8. The semiconductor device as claimed in claim 1, wherein two layers of copper interconnect provided below said capacitance element contains a bit line and a column decoding interconnect of said memory element.

9. The semiconductor device as claimed in claim 1, wherein two layers of said copper interconnect provided below said capacitance element contain a bit line and a word strap interconnect of said memory element.

10. The semiconductor device as claimed in claim 1, wherein two layer of said copper interconnect provided below said capacitance element contain a column decoding line and a word strap interconnect of said memory element.

11. The semiconductor device as claimed in claim 1, having a memory region and a logic region mounted therein in an integrated manner.

12. The semiconductor device as claimed in claim 1, wherein all of said interconnects in said interconnect layers, at least in the region having said capacitance element formed therein, are mainly composed of copper.

13. The semiconductor device as claimed in claim 1, wherein said insulating film is composed of a stacked structure having a low-k SiOCH film containing Si, O and C, and a cap insulating film formed over said interconnect, and a silicon oxide film is partially provided below said capacitor insulating film in a region excluding openings for forming said capacitance element.

14. The semiconductor device as claimed in claim 13, wherein a relation of [cap insulating film (C/Si)]/[low-k SiOCH film (C/Si)]<2 holds, assuming carbon/silicon ratios of said cap insulating film and said low-k SiOCH film as [cap insulating film (C/Si)] and [low-k SiOCH film (C/Si)], respectively.

15. The semiconductor device as claimed in claim 1, wherein said transistor has a gate electrode which serves as a word line, and impurity-diffused layers, said interconnect layer serves as a bit line, and in a plan view, said word line, said bit line, said impurity-diffused layers, and said capacitance element have quadrilateral geometries.

16. The semiconductor device as claimed in claim 1, wherein said transistor has a gate electrode which serves as a word line, and impurity-diffused layers, wherein said interconnect layer serves as a bit line, in a plan view, said word line, said bit line and said capacitance element have quadrilateral geometries, and said impurity-diffused layers have a deformed hexagonal geometry extended while being inclined from the direction of extension of said bit line.

17. The semiconductor device as claimed in claim 1, wherein said transistor has a gate electrode which serves as a word line, and impurity-diffused layers, wherein said interconnect layer serves as a bit line, in a plan view, said word line and said bit line have quadrilateral geometries, said impurity-diffused layers and said capacitance element have deformed hexagonal geometries extended while being inclined from the direction of extension of said bit line, and said bit line extends while being partially staggered in the width direction of said bit line.

18. The semiconductor device as claimed in claim 1, wherein said transistor is composed of a first impurity-diffused layer, a second impurity-diffused layer, and a gate electrode, said gate electrode is provided over said semiconductor substrate while placing a gate insulating film in between, and said first impurity-diffused layer and said second impurity-diffused layer are provided in the surficial portion of said semiconductor substrate on both sides of said gate electrode.

19. The semiconductor device as claimed in claim 18, wherein said gate insulating film is a high-k gate insulating film.

20. The semiconductor device as claimed in claim 18, wherein said gate electrode is a metal gate electrode.

21. The semiconductor device as claimed in claim 18, wherein one of said first impurity-diffused layer and said second impurity-diffused layer is a source impurity-diffused layer, and the other is a drain impurity-diffused layer.

* * * * *